United States Patent
Chih et al.

(10) Patent No.: US 11,621,040 B2
(45) Date of Patent: Apr. 4, 2023

(54) SYSTEM AND METHOD APPLIED WITH COMPUTING-IN-MEMORY

(71) Applicant: TAIWAN SEMICONDUCTOR MANUFACTURING COMPANY, LTD., Hsinchu (TW)

(72) Inventors: Yu-Der Chih, Hsinchu (TW); Meng-Fan Chang, Taichung (TW); May-Be Chen, Hsinchu (TW); Cheng-Xin Xue, Hsinchu (TW); Je-Syu Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 92 days.

(21) Appl. No.: 17/365,732

(22) Filed: Jul. 1, 2021

(65) Prior Publication Data
US 2022/0262432 A1    Aug. 18, 2022

Related U.S. Application Data

(60) Provisional application No. 63/150,224, filed on Feb. 17, 2021.

(51) Int. Cl.
*G11C 8/00*     (2006.01)
*G11C 13/00*    (2006.01)
(Continued)

(52) U.S. Cl.
CPC .......... *G11C 13/004* (2013.01); *G06F 7/5443* (2013.01); *G11C 7/06* (2013.01);
(Continued)

(58) Field of Classification Search
CPC ....... G11C 13/004; G11C 7/06; G11C 7/1051; G11C 13/0069
(Continued)

(56) References Cited

U.S. PATENT DOCUMENTS 10,389,375 B1 *   8/2019   Fick .................... H03F 3/45183
2019/0087356 A1 * 3/2019   Fick ......................... G06F 1/14

OTHER PUBLICATIONS

Wei-Hao Chen et al., "A 65nm 1Mb Nonvolatile Computing-in-Memory ReRAM Macro with Sub-16ns Multiply-and-Accumulate for Binary DNN AI Edge Processors", 2018 IEEE International Solid-State Circuits Conference, pp. 494-496.
(Continued)

*Primary Examiner* — Vu A Le
(74) *Attorney, Agent, or Firm* — Maschoff Brennan

(57) ABSTRACT

A system includes a global generator and local generators. The global generator is coupled to a memory array, and is configured to generate global signals, according to a number of a computational output of the memory array. The local generators are coupled to the global generator and the memory array, and are configured to generate local signals, according to the global signals. Each one of the local generators includes a first reference circuit and a local current mirror. The first reference circuit is coupled to the global generator, and is configured to generate a first reference signal at a node, in response to a first global signal of the global signals. The local current mirror is coupled to the first reference circuit at the node, and is configured to generate the local signals, by mirroring a summation of at least one signal at the node.

20 Claims, 12 Drawing Sheets

(51) Int. Cl.
*G11C 7/10* (2006.01)
*G06F 7/544* (2006.01)
*G11C 7/06* (2006.01)

(52) U.S. Cl.
CPC ........ *G11C 7/1051* (2013.01); *G11C 13/0069* (2013.01); *G11C 2013/0054* (2013.01)

(58) Field of Classification Search
USPC .................................................. 365/230.03
See application file for complete search history.

(56) References Cited

OTHER PUBLICATIONS

Cheng-Xin Xue et al., "A 1Mb Multibit ReRAM Computing-In-Memory Macro with 14.6ns Parallel MAC Computing Time tor CNNBased Al Edge Processors", 2019 IEEE International Solid-State Circuits Conference, pp. 388-390.

Cheng-Xin Xue et al., "A CMOS-integrated compute-in-memory macro based on resistive random-access memory for Al edge devices", Nature Electronics, vol. 4, Jan. 2021, pp. 81-90.

\* cited by examiner

SYSTEM AND METHOD APPLIED WITH COMPUTING-IN-MEMORY

CROSS-REFERENCE TO RELATED APPLICATION(S)

This application claims the benefit of U.S. Provisional Application Ser. No. 63/150,224, filed Feb. 17, 2021, which is herein incorporated by reference.

BACKGROUND

In computing-in-memory (CIM) application, data are accessed from the memory cells of a device for various computations including, for example, logic or mathematical operations. The computational results, such as multiply-and-accumulate (MAC) values, from the memory cells are configured to be distinguished by reference data. The reference data are generated by the device applied with the CIM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
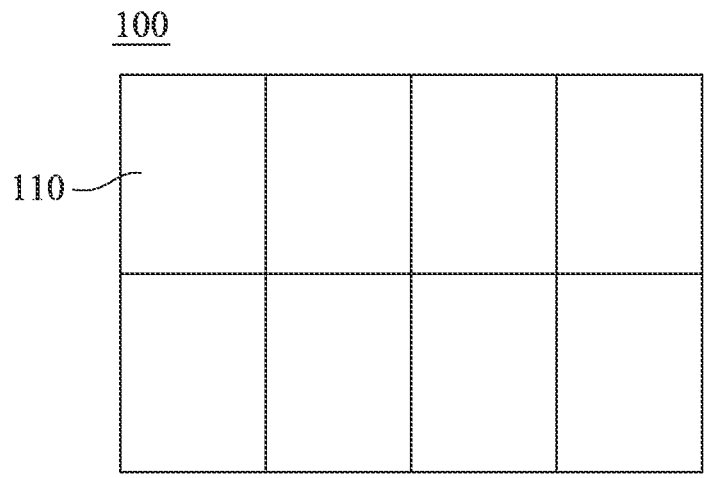
FIG. 1 is a schematic diagram of a system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 is a schematic diagram of a system 100, in accordance with some embodiments of the present disclosure. In some embodiments, the system 100 is implemented by a computing-in-memory (CIM) device. In some other embodiments, the system 100 is implemented by a Resistive random-access memory (ReRAM) CIM macro. In various embodiments, the system 100 is implemented by an artificial intelligence (AI) chip, and is utilized for AI applications.

For illustration of FIG. 1, the system 100 includes multiple banks 110 arranged in rows and columns. For simplicity of illustration, only one bank 110 is labeled in FIG. 1. In some embodiments, the banks 110 have similar configurations. In various embodiments, at least one of the banks 110 is selected to operate corresponding operations.

The numbers and arrangements of the bank 110 illustrated in FIG. 1 are given for illustrative purposes. Various numbers and arrangements of the bank 110 to implement the system 100 applied with CIM are within the contemplated scope of the present disclosure.

Figure 2:
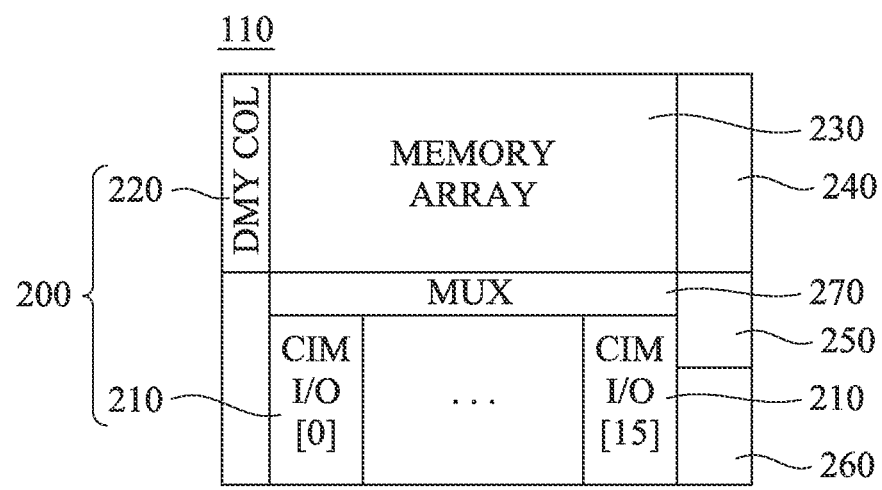
FIG. 2 is a schematic diagram of a part of a system corresponding to the system shown in FIG. 1, in accordance with some embodiments of the present disclosure.

FIG. 2 is a schematic diagram of the bank 110, which is a part of the system 100 shown in FIG. 1, in accordance with some embodiments of the present disclosure.

For illustration of FIG. 2, the bank 110 includes a computing circuitry 200, for processing computations like logic or mathematical operations in memory. The computing circuitry 200 includes multiple local units 210 and a global unit 220. The local units 210 are arranged in columns, and each one of the local units 210 is coupled to the global unit 220. For simplicity of illustration, only few local units 210 are illustrated and labeled in FIG. 2.

Moreover, as illustrated in FIG. 2, the bank 110 further includes a memory array 230, a word line driver 240, a global memory control circuit 250, an input/output (I/O) buffer 260, and a multiplexer (MUX) 270. The memory array 230 is arranged adjacent to the local units 210 and the global unit 220. The memory array 230 is coupled to the global unit 220, and is also coupled through the MUX 270 to the local units 210. The word line driver 240, the global memory control circuit 250 and the I/O buffer 260 are coupled together to the memory array 230, for selecting at least one memory cell in the memory array 230.

The local units 210 are configured to read computational results from or write the computational results into the memory array 230. A number of the local units 210 is associated with a size of the memory array 230. Alternatively stated, a number of the local units 210 is determined by a number of columns and/or rows of the memory array 230. For example, the memory array 230 has a plurality of memory cells that are arranged in 512 rows and 512 columns. With such configurations, in some embodiments, there are 16 local units 210 arranged in the bank 110. The configurations of the local units 210 are discussed in detailed below at least with reference to FIG. 3. In some embodiments, the local units 210 are also indicated as CIM I/O circuits.

The global unit 220 is configured to collaborate with the local units 210. Specifically, the global unit 220 is configured to generate global reference signals (which are shown at least in FIG. 4) to each one of the local units 210.

Alternatively stated, the local units 210 share the global unit 220 with one another, for receiving common signals. In some embodiments, the configurations of the global unit 220 are associated with a number of outputs of the computational results, and are discussed in detailed below at least with reference to FIGS. 4 and 9-11. In some embodiments, the global unit 220 is also indicated as a dummy column circuit or a global circuit.

The configurations and arrangements of the bank 110 illustrated in FIG. 2 are given for illustrative purposes. Various configurations and arrangements of the bank 110 to implement the system 100 applied with CIM are within the contemplated scope of the present disclosure. For example, in some embodiments, the memory array 230 has a greater size than that is discussed above with reference FIG. 2, and a number of the local units 210 is more than 16.

Figure 3:
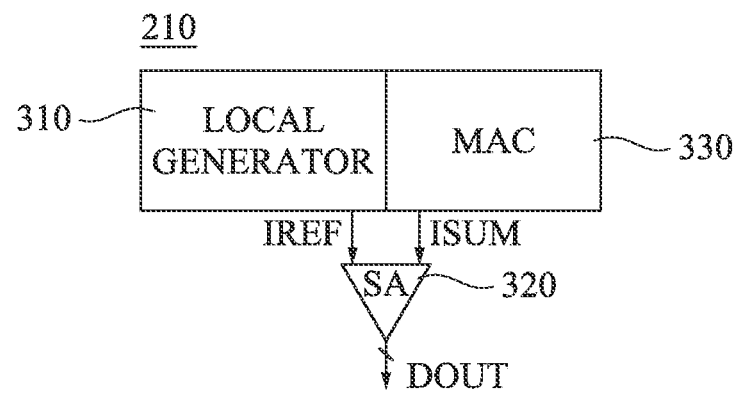
FIG. 3 is a schematic diagram of a part of a system corresponding to the system shown in FIG. 2, in accordance with some embodiments of the present disclosure.

FIG. 3 is a schematic diagram of one of the local units 210, which is a part of the computing circuitry 200 of the corresponding system shown in FIG. 2, in accordance with some embodiments of the present disclosure. The local unit 210 is indicated as CIM I/O circuit 210 hereinafter, in some embodiments.

For illustration of FIG. 3, the CIM I/O circuit 210 includes a local generator 310, a sense amplifier (SA) 320, and a multiply-and-accumulate (MAC) circuit 330. Input terminals of the SA 320 are coupled to the local generator 310 and the MAC circuit 330, respectively. With reference to FIGS. 2-3, output terminal of the SA 320 is coupled through the MUX 270 to the memory array 230.

With reference to FIGS. 2-3, the local generator 310 is further coupled to the global unit 220, and is configured to receive global reference signals (which are shown at least in FIG. 4) from the global unit 220. The local generator 310 is further configured to generate local reference signals IREF to the SA 320, according to the received global reference signals.

Moreover, with reference to FIGS. 2-3, the MAC circuit 330 is further coupled to the memory array 230, and is configured to generate at least one MAC signal ISUM to the SA 320. The MAC signals ISUM are indicated as the computational results of the memory array 230.

The SA 320 is configured to generate output signals DOUT to the memory array 230 (shown in FIG. 2), according to the local reference signals IREF and the MAC signals ISUM. The output signals DOUT are configured to distinguish candidates of the computational results of the memory array 230. Specifically, in some embodiments, the SA 320 is configured to compare values of the reference signals IREF with values of the MAC signals ISUM correspondingly, to output the output signals DOUT. In some embodiments, the SA 320 is implemented by a current sense amplifier.

In some embodiments, the local reference signals IREF and the global reference signals (which are shown at least in FIG. 4) are analog signals. In some other embodiments, the MAC signals ISUM are analog signals. In various embodiments, the global reference signals have current values within a range of current values of the MAC signals ISUM.

In some embodiments, the output signals DOUT are digital signals, and are also indicated as the digital signals DOUT hereinafter. A number of the digital signals DOUT is associated with a number of the outputs of the computational results, in some embodiments. For example, a number of the digital signals DOUT is equal to a number of the outputs of the computational results.

Figure 4:
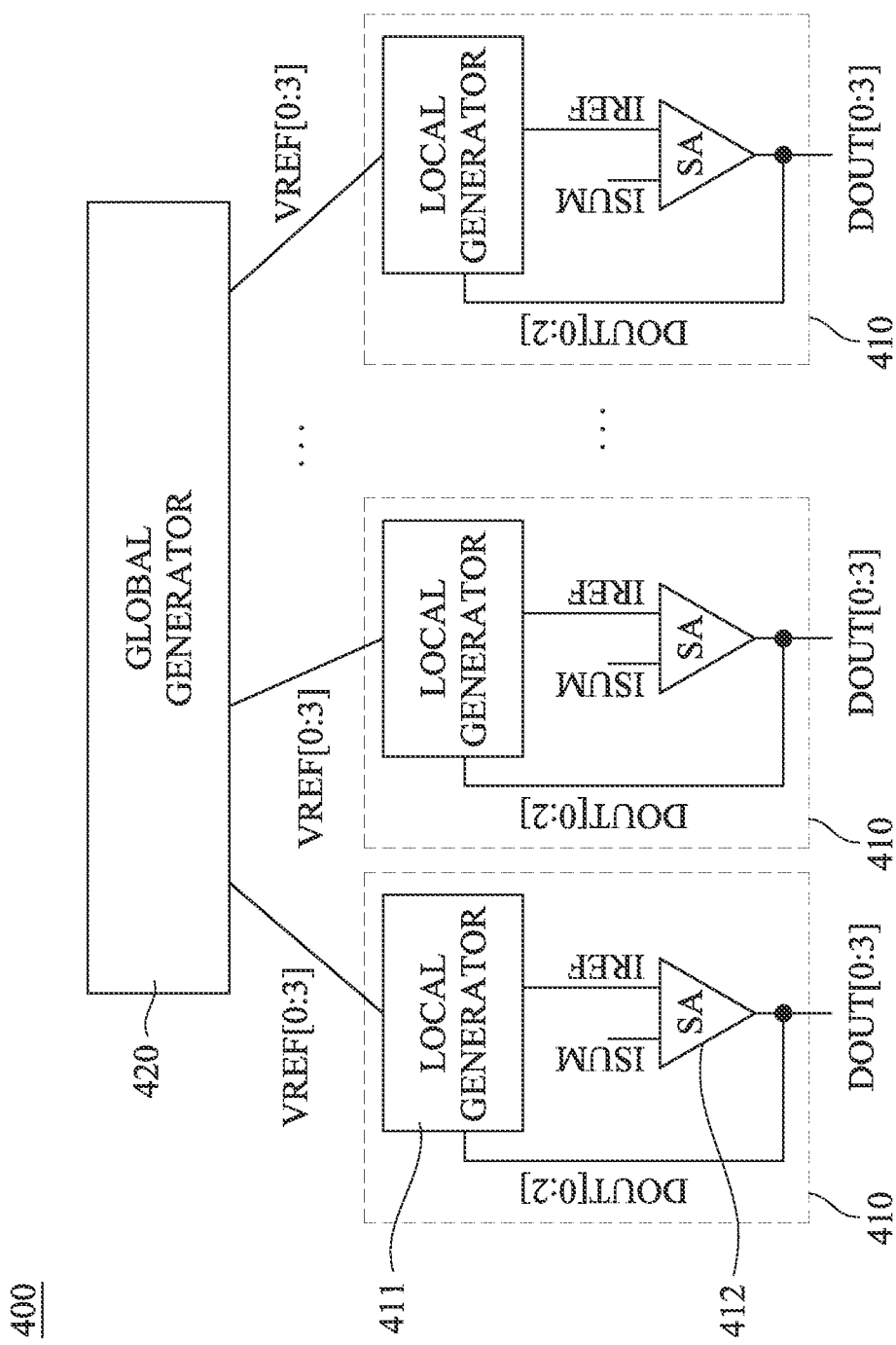
FIG. 4 is a schematic diagram of a part of a system corresponding to the system shown in FIG. 1, in accordance with some embodiments of the present disclosure.

Reference is now made to FIG. 4. FIG. 4 is a schematic diagram of a reference circuitry 400, which is a part of the system 100 shown in FIG. 1, in accordance with some embodiments of the present disclosure. In some embodiments, the reference circuitry 400 is a part of an exemplary embodiment of the computing circuitry 200 shown in FIG. 2. As such, similar configurations are not further detailed herein.

For illustration of FIG. 4, the reference circuitry 400 includes several local units 410 and a global unit 420. For simplicity of illustration, only few local units 410 are illustrated and labeled in FIG. 4. The local units 410 have the same configurations, in some embodiments. The global unit 420 is coupled to each one of the local units 410, and is configured to generate global reference signals VREF[0:3] to each one of the local units 410. The number of the global reference signals VREF[0:3] illustrated in FIG. 4 is given for illustrative purposes. Various numbers of the global reference signals VREF[0:3] are within the contemplated scope of the present disclosure.

Moreover, as illustrated in FIG. 4, each one of the local units 410 includes a local generator 411 and a SA 412. The local generator 411 is coupled to the SA 412 and the global unit 420. The local generator 411 is configured to generate local reference signals IREF to the SA 320, according to the global reference signals VREF[0:3] from the global unit 420 and digital signals DOUT[0:3] back from the SA 412.

In some embodiments, the local units 410 correspond to the CIM I/O circuits 210 illustrated in FIG. 2. In some other embodiments, each one of the local units 410 corresponds to a part of the CIM I/O circuits 210, excluding the MAC circuit 330, illustrated in FIG. 3. Specifically, with reference to FIGS. 3-4, the local generator 411 corresponds to the local generator 310, and the SA 412 corresponds to the SA 320. In various embodiments, the configurations of the local units 410 are discussed in detailed below at least with reference to FIG. 5.

In some embodiments, the global unit 420 corresponds to the global unit 220 illustrated in FIG. 2. In some other embodiments, the configurations of the global unit 420 are discussed in detailed below with reference to FIGS. 9-11. In various embodiments, the global unit 420 is also indicated as a global generator 420 hereinafter.

With continued reference to FIG. 4, the SA 412 is configured to generate the digital signals DOUT[0:3] to the memory array 230 (shown in FIG. 2) or to be fed back to the local generator 411, according to the local reference signals IREF and the MAC signals ISUM from the MAC circuit 330 (shown in FIG. 3).

In some embodiments, the digital signals DOUT[0:2] are fed back to the local generator 411 in various sensing cycles/stages of the local units 410, for self-controlling the local generator 411, which is discussed in detailed below with reference to FIGS. 6-8. In some other embodiments, the digital signals DOUT[0:3] are output to the memory array 230 (shown in FIG. 2), for distinguishing candidates of the computational results of the memory array 230. Alternatively stated, the digital signals DOUT[0:3] are digital reference values as a comparison with analog MAC results.

The configurations of the local units 410 shown in FIG. 4 are given for illustrative purposes. Various configurations of the local units 410 to implement the reference circuitry 400 illustrated in FIG. 4 are within the contemplated scope of the present disclosure. For example, in some embodiments, the SA 412 is not integrated with the local generator 411.

In some approaches, in a system applied with the CIM, a reference generating circuit is arranged adjacent to a memory array. The reference generating circuit is configured to generate reference signals for various possible candidates of computational results of the memory array, according to a number of word lines of the memory array. With such configurations, the system applied with the CIM has a large area for arranging the reference generating circuit and the memory array.

Compared to the above approaches, in the embodiments of the present disclosure, for example with reference to FIGS. 2-4, in the system 100 applied with the CIM, the global unit 420 is arranged separated from the local units 410, for generating the common signals to the local units 410. As such, a circuit area for generating the global and the local reference signals IREF is reduced, and a macro performance of the system 100 is increased.

Figure 5:
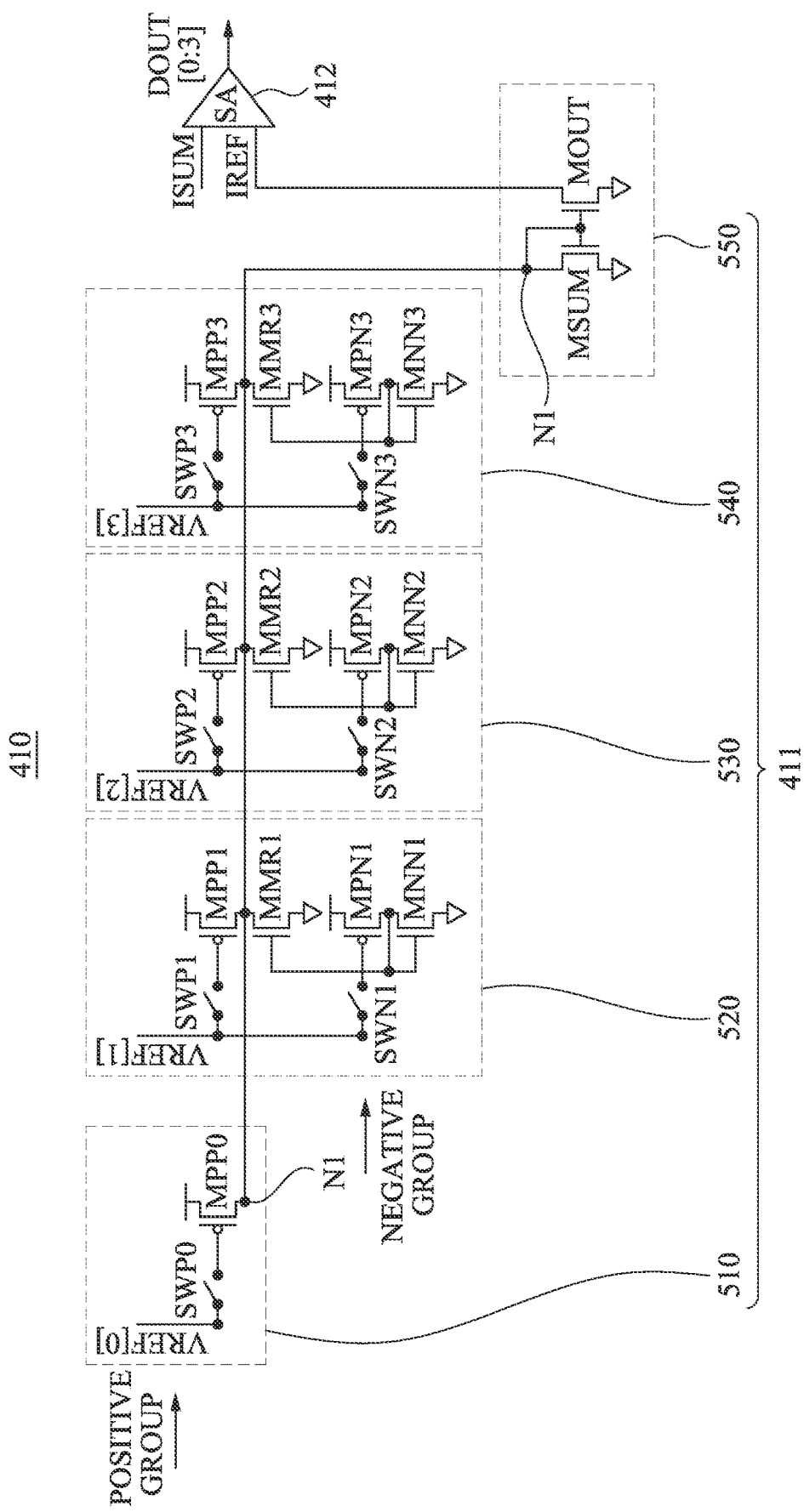
FIG. 5 is a circuit diagram of a local unit, including a local generator, corresponding to the local unit in FIG. 4, in accordance with some embodiments of the present disclosure.

Reference is now made to FIG. 5. FIG. 5 is a circuit diagram of the local unit 410 shown in FIG. 4, in accordance with some embodiments of the present disclosure. As such, similar configurations are not further detailed herein. With respect to the embodiments of FIG. 4, like elements in FIG. 5 are designated with the same reference numbers for ease of understanding. For ease of understanding, the embodiments with respect to FIG. 5 are discussed with reference to FIG. 4.

For illustration of FIG. 5, the local generator 411 includes several reference circuits including, for example, a first reference circuit 510, a second reference circuit 520, a third reference circuit 530, a fourth reference circuit 540, and a local current mirror 550. With reference to FIGS. 4-5, each one of the reference circuits 510-540 is coupled to the global generator 420, for receiving a corresponding global reference signal VREF[0], VREF[1], VREF[2] or VREF[3]. Each one of the reference circuits 510-540 is further coupled to the local current mirror 550 at a node N1, for outputting a corresponding reference signal (shown in FIGS. 7B-7E). The local current mirror 550 is further coupled to one of input terminals of the SA 412.

A number of the reference circuits of the local generator 411 is associated with a number of the outputs of the computational results, in some embodiments. Signals output from the reference circuits of the local generator 411 correspond to the outputs of the computational results, respectively. Specifically, the number of the reference circuits arranged in the local generator 411 is equal to the number of the outputs of the computational results. For example, in the following embodiments with reference to FIGS. 5-8, when the memory array 230 (shown in FIG. 2) has 4 bits of the computational results, there are 4 reference circuits 510-540 are arranged in one local generator 411. Similarly, in some other embodiments, when the memory array 230 has other numbers of bits of the computational results, the same number of the reference circuits are arranged in one local generator 411. Various numbers of the reference circuits to implement the local unit 410 are within the contemplated scope of the present disclosure.

The first reference circuit 510 includes a switch SWP0 and a p-type metal oxide semiconductor transistor (PMOS transistor) MPP0. An input terminal of the switch SWP0 is coupled to the global generator 420 (shown in FIG. 4), and an output terminal of the switch SWP0 is coupled to a gate terminal of the PMOS transistor MPP0. A source terminal of the PMOS transistor MPP0 is coupled to a first reference voltage (not shown). A drain terminal of the PMOS transistor MPP0 is coupled to the node N1, for outputting a first reference signal (shown in FIGS. 7B-7E) at the node N1.

The second reference circuit 520 includes switches SWP1 and SWN1, PMOS transistors MPP1 and MPN1, and n-type metal oxide semiconductor transistors (NMOS transistors) MNN1 and MMR1. An input terminal of the switch SWP1 is coupled to the global generator 420 (shown in FIG. 4), and an output terminal of the switch SWP1 is coupled to a gate terminal of the PMOS transistor MPP1. A source terminal of the PMOS transistor MPP1 is coupled to the first reference voltage (not shown). A drain terminal of the PMOS transistor MPP1 is coupled to the node N1, for outputting a second reference signal with a first phase (shown in FIGS. 7B-7E) at the node N1.

Furthermore, an input terminal of the switch SWN1 is coupled to the global generator 420 (shown in FIG. 4), and an output terminal of the switch SWN1 is coupled to a gate terminal of the PMOS transistor MPN1. A source terminal of the PMOS transistor MPN1 is coupled to the first reference voltage (not shown). A drain terminal of the PMOS transistor MPN1 is coupled to a drain terminal of the NMOS transistor MNN1. The drain terminal of the NMOS transistor MNN1 is further coupled to a gate terminal of the NMOS transistor MNN1, as a part of a current mirror. A source terminal of the NMOS transistor MNN1 is coupled to a second reference voltage (not shown). The gate terminal and the drain terminal of the NMOS transistor MNN1 are further coupled to a gate terminal of the NMOS transistor MMR1, as the other part of the current mirror. A drain terminal of the NMOS transistor MNN1 is coupled to the node N1, for outputting the second reference signal with a second phase (shown in FIGS. 7B-7E) at the node N1.

The third reference circuit 530 includes switches SWP2 and SWN2, PMOS transistors MPP2 and MPN2, and NMOS transistors MNN2 and MMR2. The third reference circuit 530 is configured to output a third reference signal with the first or the second phase (shown in FIGS. 7B-7E) at the node N1. The fourth reference circuit 540 includes switches SWP2 and SWN3, PMOS transistors MPP3 and MPN3, and NMOS transistors MNN3 and MMR3. The fourth reference circuit 540 is configured to output a fourth reference signal with the first or the second phase (shown in FIGS. 7B-7E) at the node N1. The configurations of each one of the third reference circuit 530 and the fourth reference circuit 540 are similar to the configurations of the second reference circuit 520, which are not discussed herein.

The NMOS transistors MNN1 and MMR1 of the second reference circuit 520 are considered as a current mirror, for providing the second reference signal mirrored from the PMOS transistor MPN1, in some embodiments. Similarly, in some other embodiments, the NMOS transistors MNN2 and MMR2 of the third reference circuit 530 are considered as a current mirror, for providing the third reference signal mirrored from the PMOS transistor MPN2. The NMOS transistors MNN3 and MMR3 of the fourth reference circuit 540 are considered as a current mirror, for providing the fourth reference signal mirrored from the PMOS transistor MPN3.

In some embodiments, the switches SWP0-SWP3 are implemented by PMOS transistors, and are operated in the saturation region. In some other embodiments, the switches SWN1-SWN3 are implemented by NMOS transistors, and are operated in the saturation region.

In some embodiments, the PMOS transistors MPP0-MPP3 and MPN1-MPN3 are operated in the linear region, for providing analog signals. In some other embodiments, the NMOS transistors MNN1-MNN3 and MMR1-MMR3 are operated in the linear region, for providing analog signals.

In some embodiments, the first reference voltage is referred to as VDD. In some embodiments, the second reference voltage is referred to as ground.

The local current mirror 550 is configured to provide local reference signals IREF, which is mirrored from the signals accumulated at the node, to the SA 412. The local current mirror 550 includes NMOS transistors MSUM and MOUT. A gate terminal and a drain terminal of the NMOS transistor MSUM are coupled together at the node N1, and are further coupled to a gate terminal of the NMOS transistor MOUT. Source terminals of the NMOS transistors MSUM and MOUT are coupled to the second reference voltage (not shown). A drain terminal of the NMOS transistor MOUT is coupled to one of the input terminals of the SA 412, for outputting the local reference signals IREF to the SA 412.

With reference to FIG. 5, in some embodiments, the switches SWP0-SWP3 and the PMOS transistors MPP0-MPP3 are considered as a positive group of the local generator 411. The switches SWN1-SWN3, the PMOS transistors MPN1-MPN3 and the NMOS transistors MNN1-MNN3 and MMR1-MMR3 are considered as a negative group of the local generator 411. The positive group of the local generator 411 is configured to generate reference signals with the first phase at the node N1, and the negative group of the local generator 411 is configured to generate reference signals with the second phase at the node N1. For the node N1, which is the input terminal of the local current mirror 550, the first phase is opposite from the second phase, which is discussed in detailed below with reference to FIGS. 6-8. Alternatively stated, the local generator 411 includes the positive group for generating reference signals with the first phase at the node N1, and also includes the negative group for generating reference signals with the second phase at the node N1.

The configurations and arrangements of the local unit 410 illustrated in FIG. 5 are given for illustrative purposes. Various configurations and arrangements of the local unit 410 to implement the system 100 applied with CIM are within the contemplated scope of the present disclosure.

Reference is now made to FIG. 6, FIGS. 7A-7E, and FIG. 8.

Figure 6:
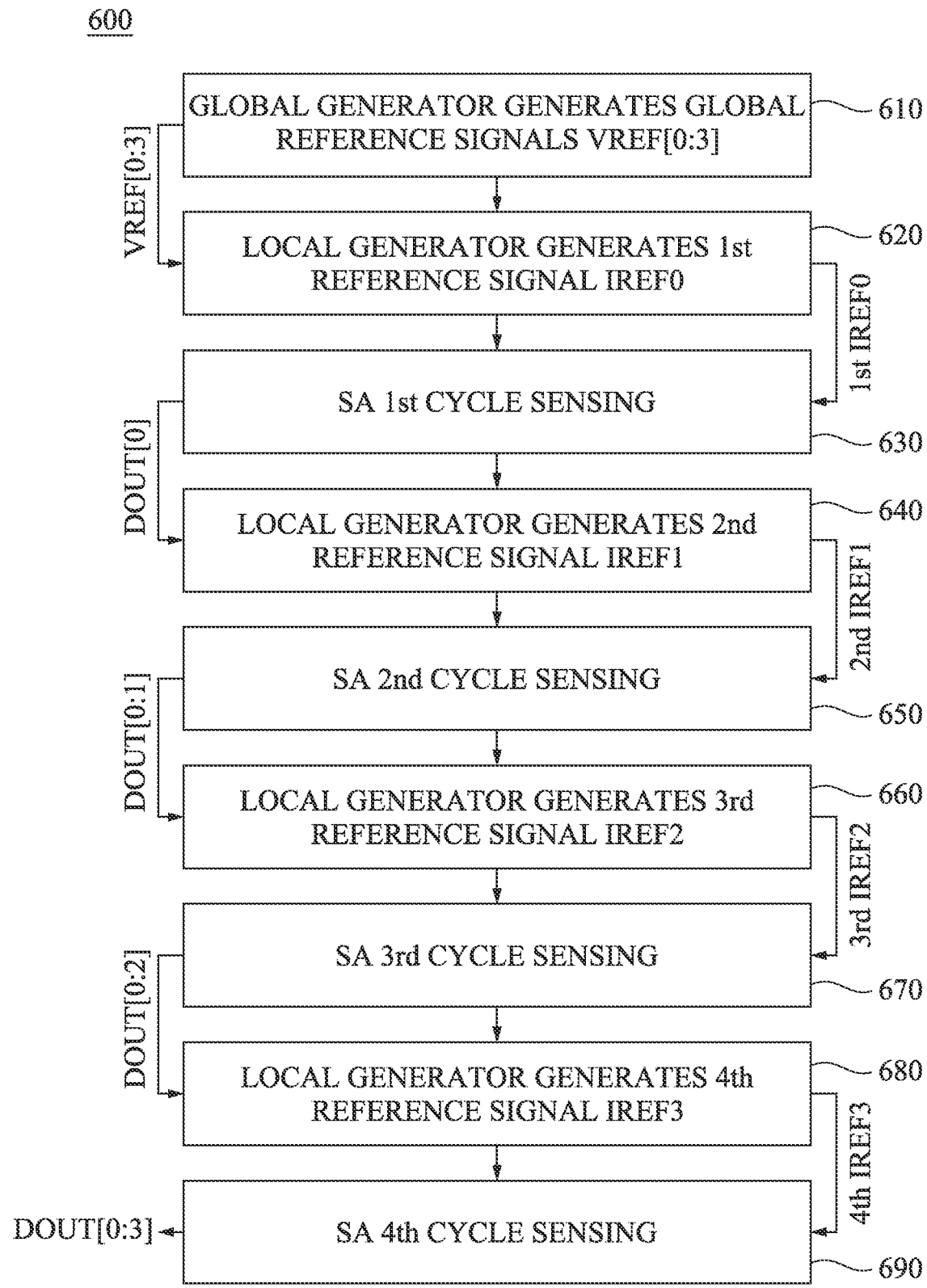
FIG. 6 is a flow chart of a method for operating a system corresponding to the system in FIGS. 4-5, in accordance with some embodiments of the present disclosure.

FIG. 6 is a flow chart of a method 600 for operating the global generator 420 and one of the local units 410 in FIG. 4 of the corresponding system, in accordance with some embodiments of the present disclosure. One of the local units 410 in FIG. 4 takes the local unit 410 in FIG. 5 as an exemplary embodiment, for illustrating the method 600.

FIGS. 7A-7E are circuit diagrams of the local unit 410 shown in FIG. 5 in various operations of the method 600 in FIG. 6, in accordance with some embodiments of the present disclosure. The circuit diagrams of the local unit 410 in FIGS. 7A-7E and that in FIG. 5 are the same, which is not discussed herein. With respect to the embodiments of FIG. 5, like elements in FIGS. 7A-7E are designated with the same reference numbers for ease of understanding.

Figure 7A:
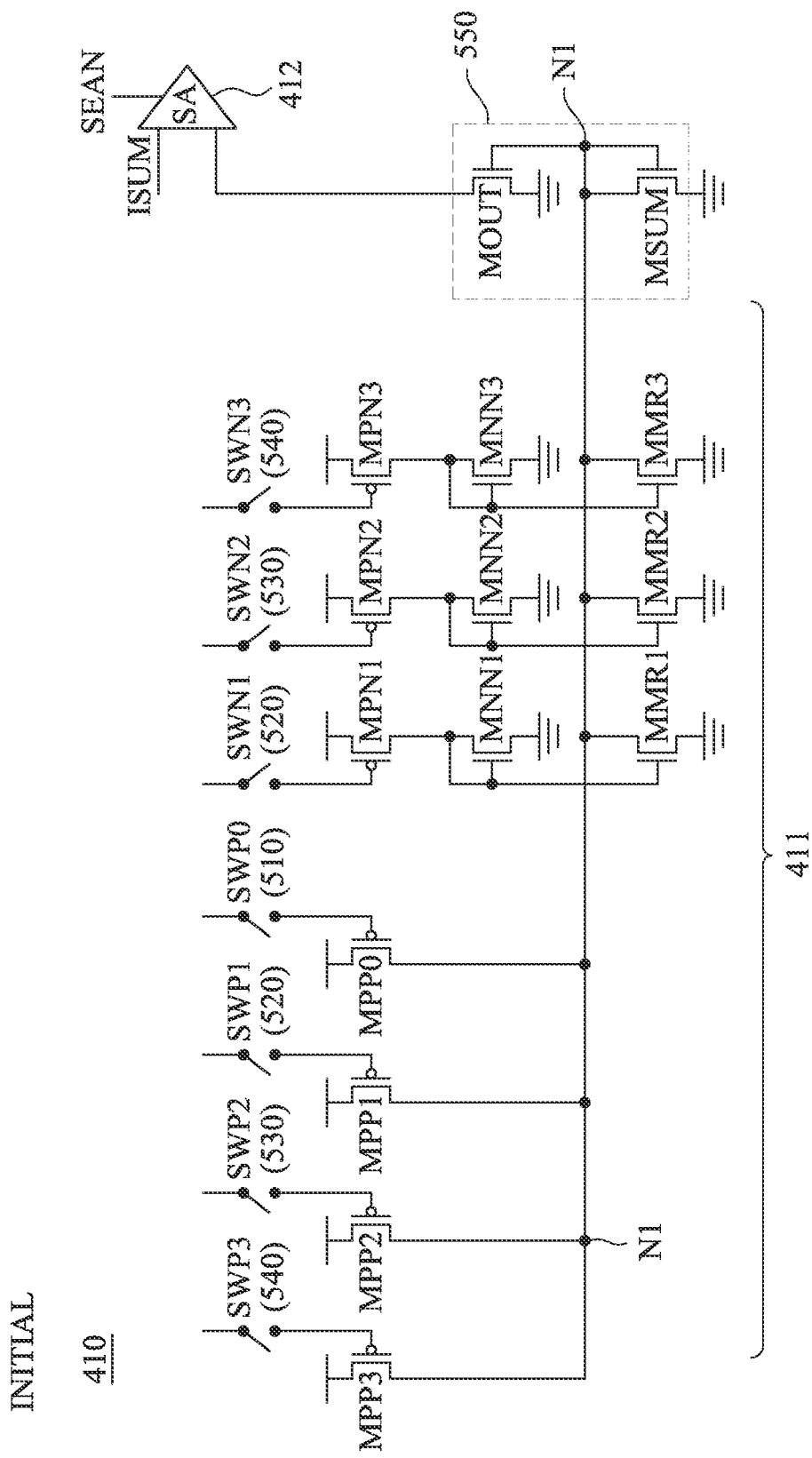
FIGS. 7A-7E are circuit diagrams of the local unit shown in FIG. 5 in various cycles corresponding to the operations in FIG. 6, in accordance with some embodiments of the present disclosure.
Figure 7B:
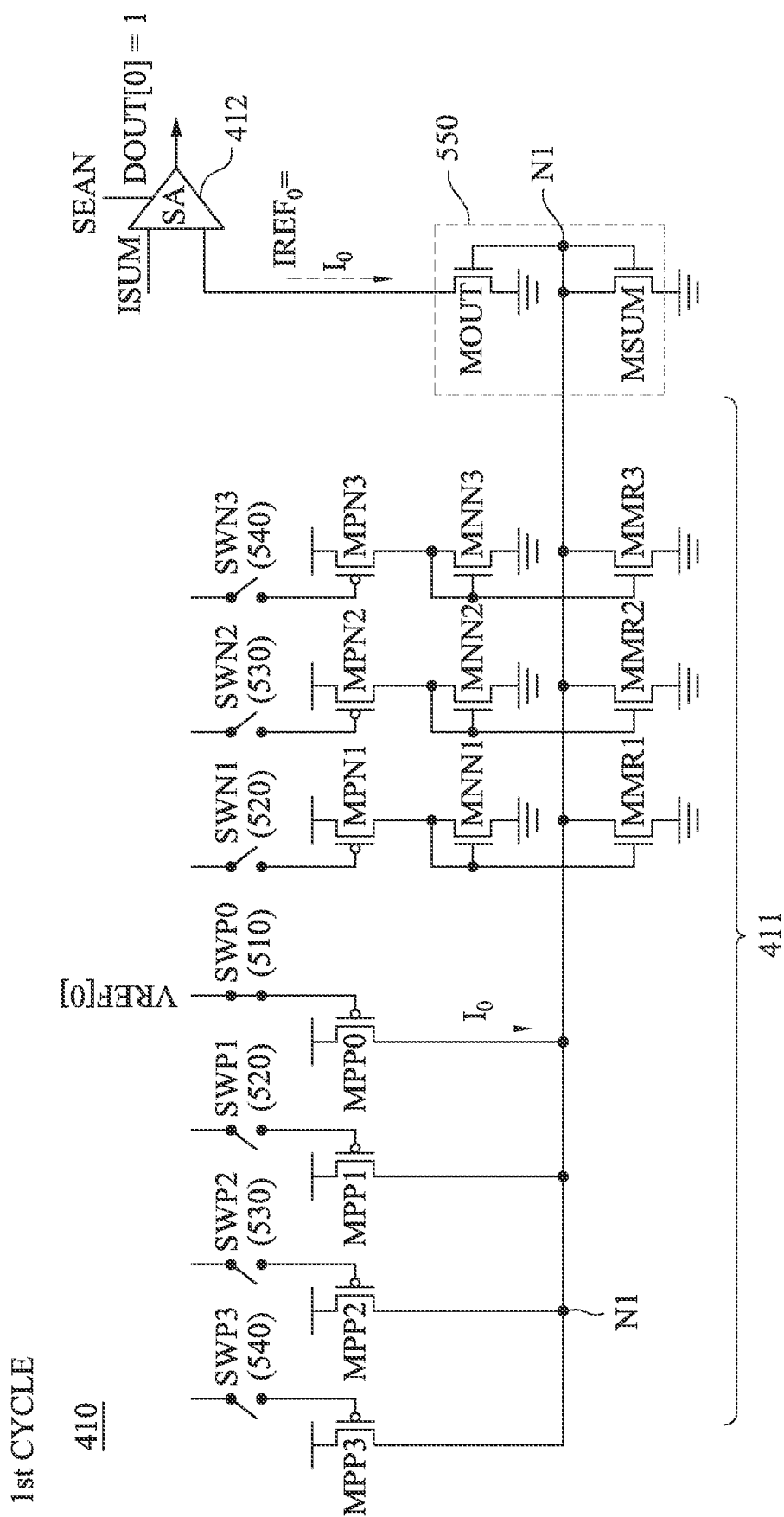
Figure 7C:
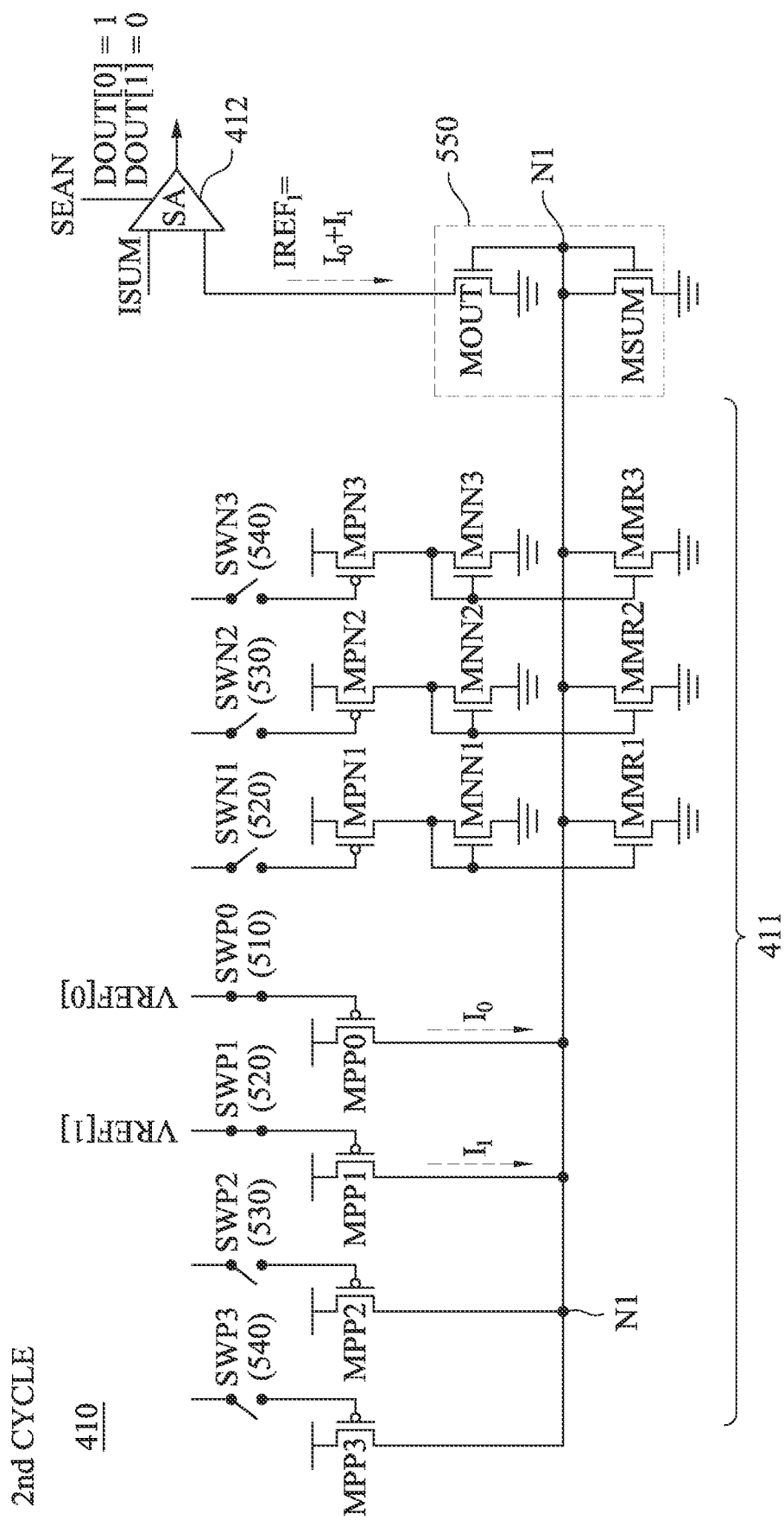
Figure 7D:
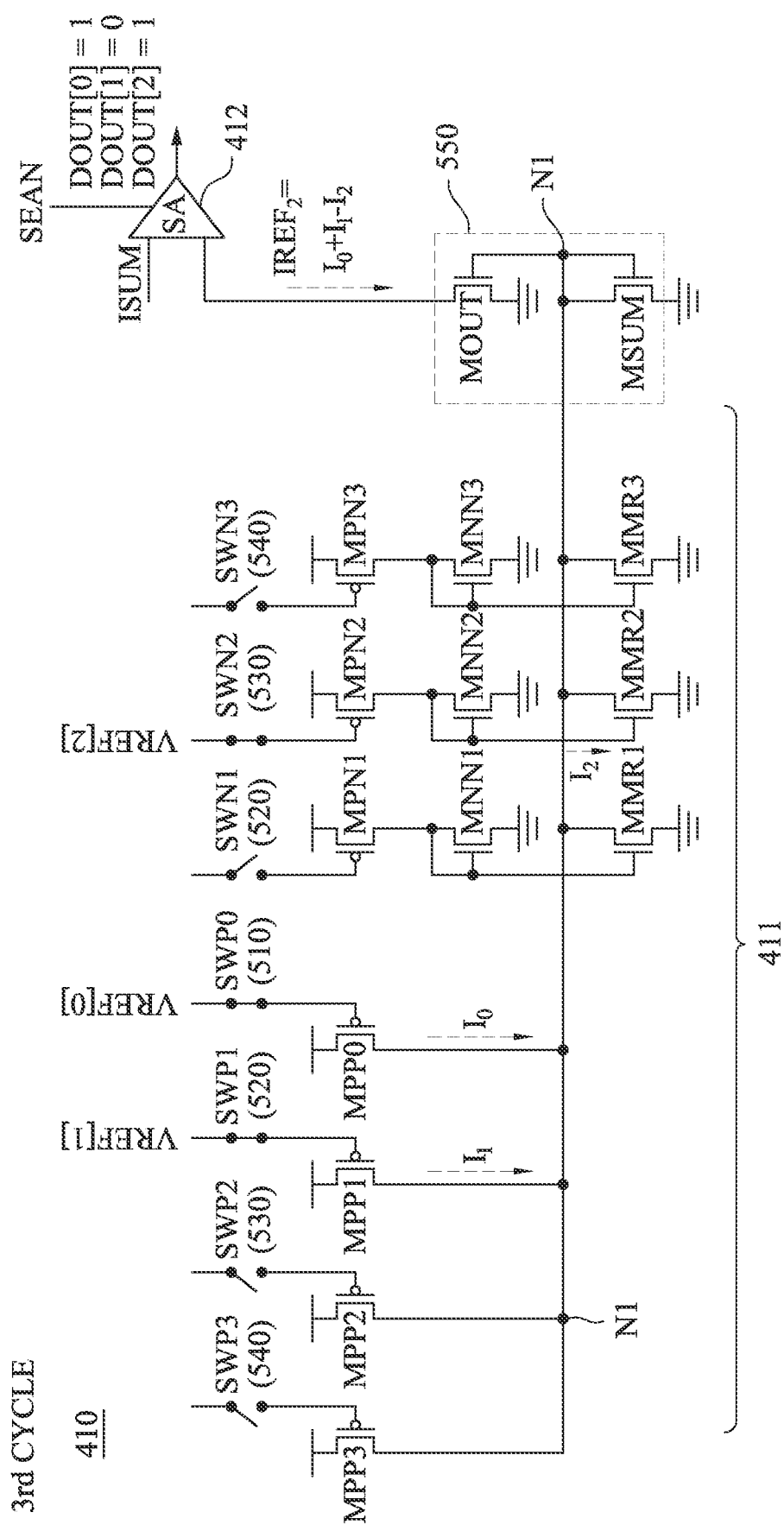
Figure 7E:
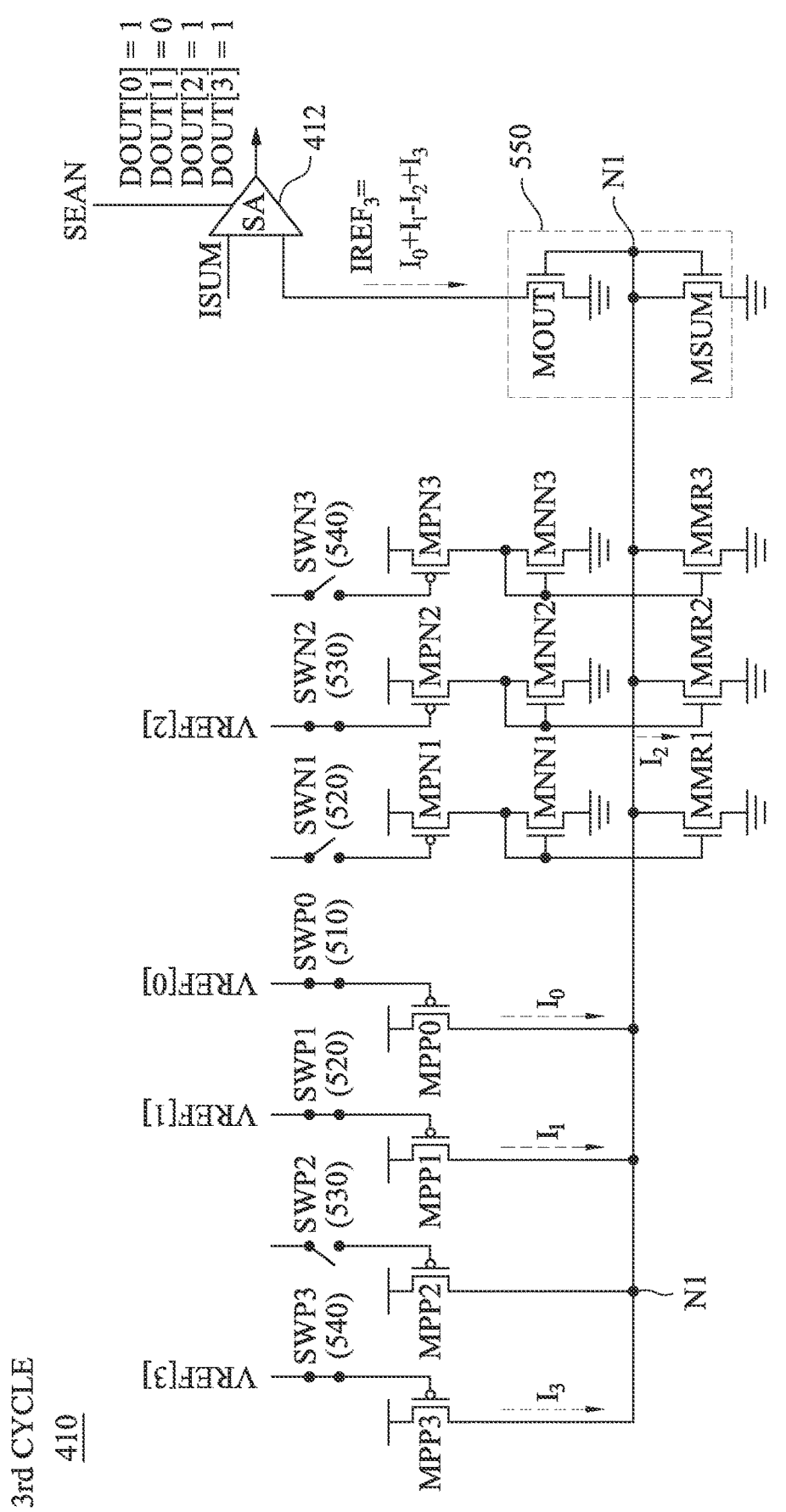
Figure 8:
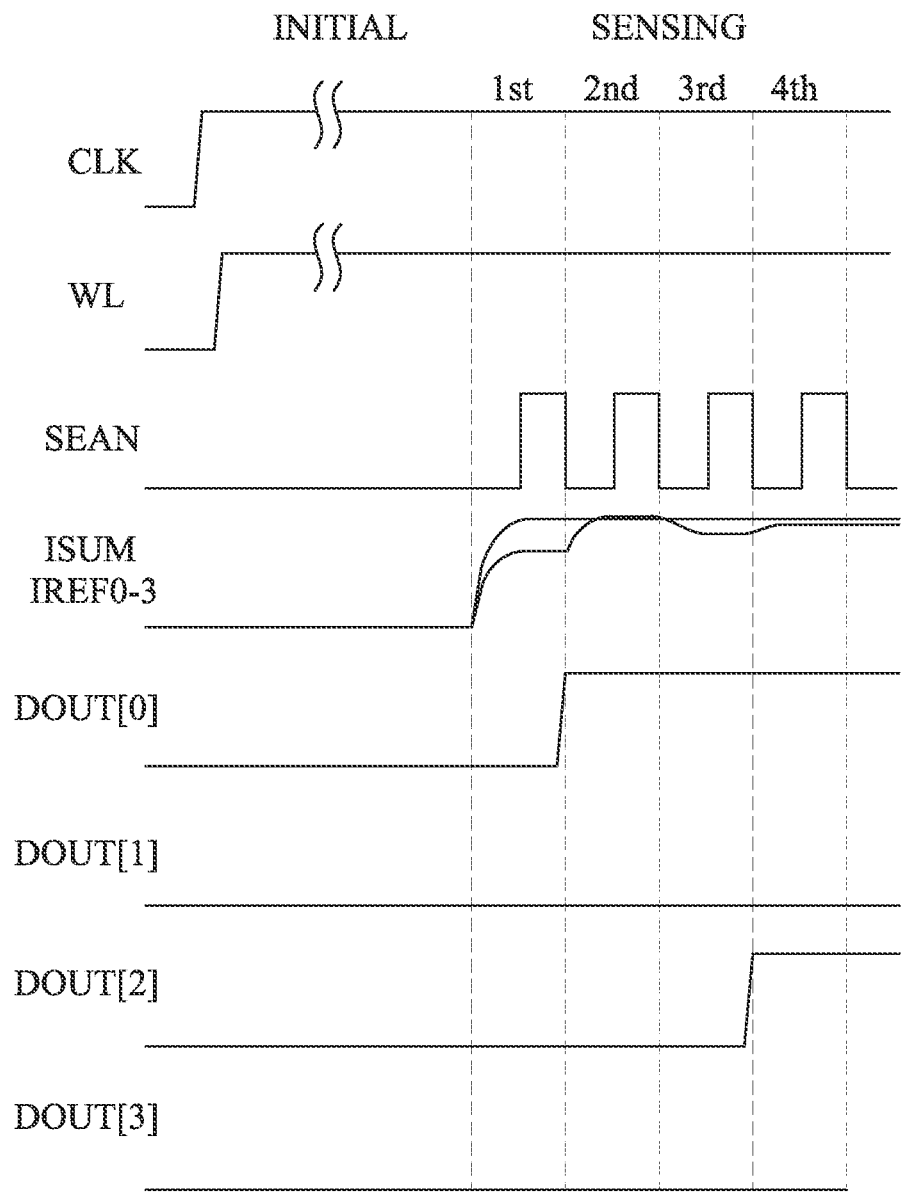
FIG. 8 is a signal waveform diagram of a relationship between times on relative signals in the local unit shown in FIGS. 7A-7E, in accordance with some embodiments of the present disclosure.

FIG. 8 is a signal waveform diagram of a relationship between times on relative signals in the local unit 410 shown in FIGS. 7A-7E, in accordance with some embodiments of the present disclosure. With respect to the embodiments of FIGS. 7A-7E, like elements in FIG. 8 are designated with the same reference numbers for ease of understanding. As illustrated in FIG. 8, various signals utilized in the local unit 410 shown in FIGS. 7A-7E are illustrated. These signals are utilized during the operation of generating the digital signals DOUT[0:3] for distinguishing candidates of the computational results of the memory array 230 (shown in FIG. 2).

Following illustrations of the method 600 in FIG. 6 with reference to the global generator 420 shown in FIG. 4, the local unit 410 shown in FIGS. 7A-7E and the signals shown in FIG. 8 thereof include exemplary operations, and have 4 bits computational output configurations of the memory array 230 (shown in FIG. 2). However, the operations in FIG. 6 are not necessarily performed in the order shown. Alternatively stated, operations may be added, replaced, changed order, and/or eliminated as appropriate, in accordance with the spirit and scope of various embodiments of the present disclosure.

The method 600 includes the operations 610-690. The operations 610-690 are discussed below with reference to FIGS. 7A-7E and 8, for illustrating the method 600 in various stages/cycles/phases. As shown in FIG. 8, signals followed by the method 600 are illustrated in operation duration which includes an initial duration and a multi-level sensing duration. The multi-level sensing duration are separated into a first sensing cycle, a second sensing cycle, a third sensing cycle, and a fourth sensing cycle, as discussed in detailed below.

In some embodiments, with references to FIGS. 2 and 7A-8, a clock signal CLK is utilized in the memory array 230 as an initial signals model for generations of other signals. The other signals generated according to the clock signal CLK include, for example, a word line signal WL and an enable signal SEAN. The word line signal WL is generated by the word line driver 240, and is utilized in the memory array 230 for reading or writing operations in the memory array 230. The enable signal SEAN is utilized in the SA 412 for activating the SA 412.

In the operation 610, a global generator generates global reference signals VREF[0:3] to each one of local generators. For illustration, as shown in FIG. 4, the global generator 420 generates the global reference signals VREF[0:3] to each one of the local units 410.

Before the operation 610 is performed, the local generator is in the initial duration, in some embodiments. For illustration, as shown in FIG. 7A, the local generator 411 is in the initial cycle. The local generator 411 has no received global reference signals VREF[0:3], nor outputting signals (shown in FIGS. 7B-7E). Specifically, all of the switches SWP0-SWP3 and SWN1-SWN3 are turned off. Furthermore, as illustrated in FIG. 8, the signals in the initial duration are utilized in the embodiment in FIG. 7A, and are followed by such operation before the operation 610 in FIG. 6.

During the multi-level sensing duration, the signals in the first cycle in FIG. 8 are utilized in the embodiment in FIG. 7B, and are followed by the operations 620-630 in FIG. 6.

In the operation 620, the local generator generates a first local reference signal IREF0 to the SA, in response to the global reference signals VREF[0:3]. For illustration, as shown in FIG. 7B, the local generator 411 is activated, and is operated in the first cycle after the initial cycle.

With reference to FIG. 7B, the first reference circuit 510 of the local generator 411 is activated, in response to the global reference signal VREF[0]. Specifically, the switch SWP0 is turned on, to bypass the global reference signal VREF[0] to the PMOS transistor MPP0. The PMOS transistor MPP0 is activated, in response to the global reference signal VREF[0] from the switch SWP0. As such, the activated PMOS transistor MPP0 provides a first reference signal I0 flowing into the node N1. Alternatively stated, for the node N1, the first reference signal I0 with a positive phase is provided.

Subsequently, with reference to FIG. 7B, the local current mirror 550 is activated to provide the first local reference signal IREF0 to the SA 412, in response to the first reference signal I0 at the node N1. Specifically, the NMOS transistors MSUM and MOUT are activated, in response to the first reference signal I0. Since the first reference signal I0 flows into the gate terminal and the drain terminal of the NMOS transistor MSUM, the first reference signal I0 is mirrored from the gate terminal and the drain terminal of the NMOS transistor MSUM to the drain terminal of the NMOS transistor MOUT. Therefore, the first reference signal I0 is provided to the input of the SA 412, as the first local reference signal IREF0.

In the operation 630, the SA performs sensing signals in the first cycle, to generate the digital signal DOUT[0], at least according to the first local reference signal IREF0. For illustration, as shown in FIG. 7B, the SA 412 senses input signals ISUM and IREF0 in the first cycle, and generates the digital signal DOUT[0], according to the signals ISUM and IREF0.

With continued reference to FIG. 7B, the SA 412 is activated to provide the digital signal DOUT[0] to be fed back to the local generator 411, in response to the enable signal SEAN. The activated SA 412 senses the input signals ISUM and IREF0, and generates the digital signal DOUT[0], according to a comparison between the first reference signal I0 from the local current mirror 550 and the MAC signals ISUM from the MAC circuit 330 (shown in FIG. 3). When a current value of the first local reference signal IREF0 is greater than a current value of the MAC signals ISUM, in some embodiments, the activated SA 412 outputs the digital signal DOUT[0] with a digital value "1". On contrast, the activated SA 412 outputs the digital signal DOUT[0] with a digital value "0". In the following embodiments, it is assumed that the digital signal DOUT[0] has the value "1".

During the multi-level sensing duration, the signals in the second cycle in FIG. 8 are utilized in the embodiment in FIG. 7C, and are followed by the operations 640-650 in FIG. 6.

In the operation 640, the local generator generates a second local reference signal IREF1 to the SA, in response to the global reference signals VREF[0:3]. For illustration, as shown in FIG. 7C, the local generator 411 is activated, and is operated in the second cycle after the first cycle.

Compared to embodiments of FIG. 7B, with reference to FIG. 7C, the second reference circuit 520 of the local generator 411 is also activated, in response to the global reference signal VREF[1]. Specifically, in response to the global reference signal VREF[1] and the fed back digital signal DOUT[0], the switch SWP1 is turned on, to bypass the global reference signal VREF[1] to the PMOS transistor MPP1. The PMOS transistor MPP1 is activated, in response to the global reference signal VREF[1] from the switch SWP1. As such, the activated PMOS transistor MPP1 provides a second reference signal I1 flowing into the node N1. Alternatively stated, for the node N1, the second reference signal I1 with the positive phase is provided.

Due to the digital signal DOUT[0] with a corresponding value "1" or "0", one of the switch SWP1 or SWN1 of the second reference circuit 520 is turned on, to bypass the global reference signal VREF[1]. Alternatively stated, the fed back digital signal DOUT[0] controls one of a positive group or a negative group of the second reference circuit 520 being activated. With continued reference to FIG. 7C, in some embodiments, the switch SWN1 is turned off, in response to the fed back digital signal DOUT[0].

Subsequently, with reference to FIG. 7C, the local current mirror 550 is activated to provide the second local reference signal IREF1 to the SA 412, in response to the signals that are accumulated at the node N1. Specifically, the NMOS transistors MSUM and MOUT are activated, in response to the accumulation of the first reference signal I0 and the second reference signal I1 at the node N1. Similar to the operations discussed above with reference to FIGS. 6 and 7B, an accumulation of the signals at the node N1, which is referred to as a sum of the first reference signal I0 with the positive phase and the second reference signal I1 with the positive phase, is provided to the input of the SA 412, as the second local reference signal IREF1.

In the operation 650, the SA performs sensing signals in the second cycle, to generate the digital signals DOUT[0:1] to be fed back to the local generator, at least according to the signals output from the local current mirror. For illustration, as shown in FIG. 7C, the SA 412 senses input signals ISUM and IREF1 in the second cycle, and generates the digital signals DOUT[0:1], according to the signals ISUM and IREF1.

The specific operations of the SA 412 in the second cycle is similar to that is discussed above with reference to FIGS. 6 and 7B, which is not discussed herein. In the following embodiments, the digital signal DOUT[1] has the value "0", since a current value of the second local reference signal IREF1 is less than a current value of the MAC signals ISUM.

During the multi-level sensing duration, the signals in the third cycle in FIG. 8 are utilized in the embodiment in FIG. 7D, and are followed by the operations 660-670 in FIG. 6.

In the operation 660, the local generator generates a third local reference signal IREF2 to the SA, in response to the global reference signals VREF[0:3]. For illustration, as shown in FIG. 7D, the local generator 411 is activated, and is operated in the third cycle after the second cycle.

Compared to embodiments of FIG. 7C, with reference to FIG. 7D, the third reference circuit 530 of the local generator 411 is also activated, in response to the global reference signal VREF[2]. Specifically, in response to the global reference signal VREF[2] and the fed back digital signal DOUT[1], the switch SWP2 is turned off, and the switch SWN1 is turned on to bypass the global reference signal VREF[2] to the PMOS transistor MPN2. As such, a third reference signal I2 flows through the PMOS transistor MPN2 to the NMOS transistors MNN2 and MNR2. Thereby, the NMOS transistors MNN2 and MNR2 are activated, in response to the global reference signal VREF[2] from the switch SWN1 through the PMOS transistor MPN2. The activated NMOS transistors MNN2 and MNR2 operate as a current mirror, to provide the third reference signal I2 flowing out from the node N1. Alternatively stated, for the node N1, the third reference signal I2 with a negative phase is provided.

In the third cycle, with reference to FIG. 7D, the signals that are accumulated at the node N1 are contributed from the first reference circuit 510 and the corresponding parts of the second reference circuit 520 and the third reference circuit 530. For the node N1, the first reference signal I0 and the second reference signal I1 flow into the node N1, and the third reference signal I2 flows out from the node N1. With such configurations, the accumulated signal at the node N1 is referred to as a sum of the first reference signal I0 with the positive phase, the second reference signal I1 with the positive phase and the third reference signal I2 with the negative phase. Accordingly, the accumulated signal at the node N1 is indicated as "I0+I1−I2", in some embodiments.

Subsequently, with reference to FIG. 7D, the local current mirror 550 is activated to provide the third local reference signal IREF2 to the SA 412, in response to the signals that are accumulated at the node N1. Specifically, the NMOS transistors MSUM and MOUT are activated, in response to the accumulation of the first reference signal I0, the second reference signal I1, and the third reference signal I2 at the node N1. Similar to the operations discussed above with reference to FIGS. 6 and 7B-7C, an accumulation of the signals at the node N1, indicating as "I0+I1−I2", is provided to the input of the SA 412, as the third local reference signal IREF2.

In the operation 670, the SA performs sensing signals in the third cycle, to generate the digital signals DOUT[0:2] to be fed back to the local generator, at least according to the signals output from the local current mirror. For illustration, as shown in FIG. 7D, the SA 412 senses input signals ISUM and IREF2 in the third cycle, and generates the digital signals DOUT[0:2], according to the signals ISUM and IREF2.

The specific operations of the SA 412 in the third cycle is similar to that is discussed above with reference to FIGS. 6 and 7B-7C, which is not discussed herein. In the following embodiments, the digital signal DOUT[2] has the value "1", since a current value of the third local reference signal IREF2 is greater than a current value of the MAC signals ISUM.

During the multi-level sensing duration, the signals in the fourth cycle in FIG. 8 are utilized in the embodiment in FIG. 7E, and are followed by the operations 680-690 in FIG. 6.

In the operation 680, the local generator generates a fourth local reference signal IREF3 to the SA, in response to the global reference signals VREF[0:3]. For illustration, as shown in FIG. 7E, the local generator 411 is activated, and is operated in the fourth cycle after the third cycle.

Compared to embodiments of FIG. 7D, with reference to FIG. 7E, the fourth reference circuit 540 of the local generator 411 is activated, in response to the global reference signal VREF[3]. Specifically, in response to the global reference signal VREF[3] and the fed back digital signal DOUT[2], the switch SWN3 is turned off, and the switch SWP3 is turned on to bypass the global reference signal VREF[3] to the PMOS transistor MPP3. As such, the activated PMOS transistor MPP3 provides a fourth reference signal I3 flowing into the node N1. Alternatively stated, for the node N1, the fourth reference signal I3 with the positive phase is provided.

In the fourth cycle, with reference to FIG. 7E, for the node N1, the first reference signal I0, the second reference signal I1 and the fourth reference signal I3 flow into the node N1, and the third reference signal I2 flows out from the node N1. With such configurations, the accumulated signal at the node N1 is referred to as a sum of the first reference signal I0 with the positive phase, the second reference signal I1 with the positive phase, the third reference signal I2 with the negative phase, and the fourth reference signal I3 with the positive phase. Accordingly, the accumulated signal at the node N1 is indicated as "I0+I1−I2+I3", in some embodiments.

Subsequently, with reference to FIG. 7E, the local current mirror 550 is activated to provide the fourth local reference signal IREF3 to the SA 412, in response to the signals that are accumulated at the node N1. Specifically, the NMOS transistors MSUM and MOUT are activated, in response to the accumulation of the signals at the node N1. Similar to the operations discussed above with reference to FIGS. 6 and 7B-7D, the accumulation of the signals at the node N1, indicating as "I0+I1−I2+I3", is provided to the input of the SA 412, as the fourth local reference signal IREF3.

In the operation 690, the SA performs sensing signals in the fourth cycle, to generate and output the digital signals DOUT[0:3] to the memory array 230 (shown in FIG. 2), at least according to the signals output from the local current mirror. For illustration, as shown in FIG. 7E, the SA 412 senses input signals ISUM and IREF3 in the fourth cycle, and generates the digital signals DOUT[0:3], according to the signals ISUM and IREF3.

The specific operations of the SA 412 in the fourth cycle is similar to that is discussed above with reference to FIGS. 6 and 7B-7D, which is not discussed herein. In the following embodiments, the digital signal DOUT[3] has the value "1", since a current value of the second local reference signal IREF3 is greater than a current value of the MAC signals ISUM.

In some approaches, in a system applied with the CIM, a local generator is configured to select one of various global reference signals from a global generator, to generate corresponding local reference signals, for all possible candidates of the computational results. With such configurations, a number of the global reference signals is large enough to be selected for generating the local reference signals. As such, the system applied with the CIM has a large number of global reference signals, which consumes great power.

Compared to the above approaches, in the embodiments of the present disclosure, for example with reference to FIGS. 4-8, the local unit 410 is configured to generate the corresponding local reference signals IREF according to the reference signals 10-13 that are accumulated at the input of the SA 412. Alternatively stated, the local reference signals IREF is generated based on a combination of the reference signals 10-13, by adding or subtracting thereof. With such configurations, the local unit 410 does not require a large number of the global reference signals for all possible candidates of the computational results. Accordingly, it reduces a number of the global reference signals and circuit area overhead. It further reduces energy consumption, and increases a macro performance.

Figure 9:
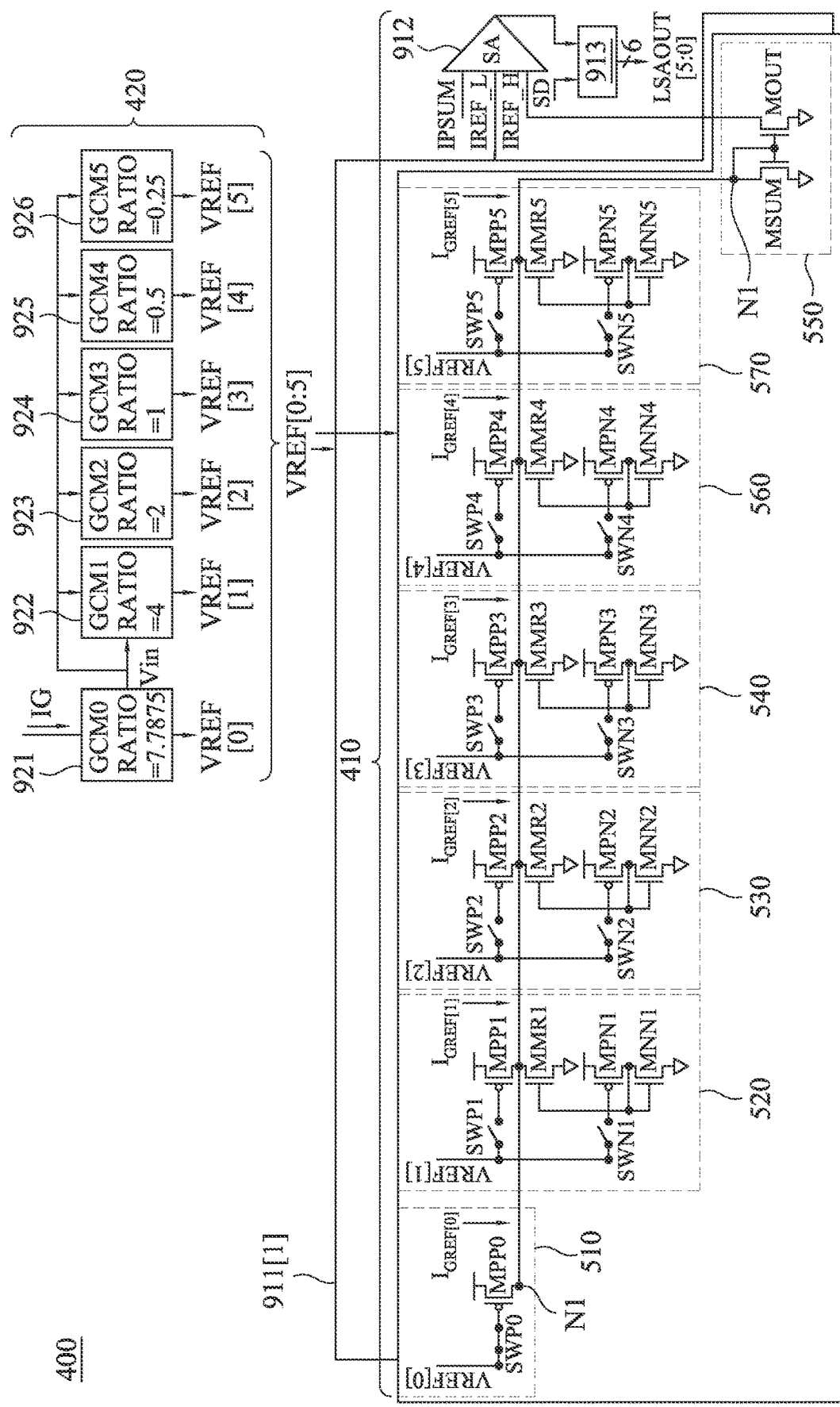
FIG. 9 is a circuit diagram of a part of a system corresponding to the system shown in FIG. 4, in accordance with some embodiments of the present disclosure.

Reference is now made to FIG. 9. FIG. 9 is a circuit diagram of the reference circuitry 400 in FIG. 4, which is a part of the system 100 shown in FIG. 1, in accordance with some embodiments of the present disclosure. In some embodiments, the local unit 410 of the reference circuitry 400 is an alternative embodiment of the local unit 410 shown in FIG. 5. As such, similar configurations are not further detailed herein. With respect to the embodiments of FIGS. 4-5, like elements in FIG. 9 are designated with the same reference numbers for ease of understanding.

Compared to FIG. 5, the local unit 410 further includes local generators 911[0] and 911[1], a SA 912 and a latch 913. Each one of the local generators 911[0] and 911[1] is coupled to the global unit 420, for receiving global reference signals VREF[0:5] from the global unit 420. Also, the local generators 911[0] and 911[1] are coupled to the SA 912, for outputting reference signals IREF_H and IREF_L respectively to the SA 912. The SA 912 is further coupled to the latch 913. The SA 912 is configured to process the reference signals IREF_H and IREF_L, and the MAC signals ISUM, to generate digital signals LSAOUT[0:5] to the latch 913. The latch 913 is further coupled to the memory array 230 (shown in FIG. 2), and is configured to output the digital signals LSAOUT[0:5] to the memory array 230, in response to an enable signal SD.

In some embodiments, the local generators 911[0] and 911[1] have the same configurations. In some other embodiments, each one of the local generators 911[0] and 911[1] is an alternative embodiment of the local unit 410 shown in FIG. 5. In various embodiments, the reference signals IREF_H and IREF_L are applied in different frequency domain, and have different phases. In some embodiments, the SA 912 is an alternative embodiment of the SA 412 shown in FIG. 5.

Moreover, compared to FIG. 5, the local generator 911[0] further includes a fifth reference circuit 560 and a sixth reference circuit 570. Each one of the fifth reference circuit 560 and the sixth reference circuit 570 has similar configuration as one of the second reference circuit 520, the third reference circuit 530, or the fourth reference circuit 540, as discussed above with reference to FIG. 5. The fifth reference circuit 560 and the sixth reference circuit 570 are configured to provide corresponding reference signals (not shown) to the local current mirror 550 at the node N1.

A number of the reference circuits 510-540 and 560-570 is associated with a number of the outputs of the computational results, in some embodiments. For example, in the embodiments with reference to FIG. 9, when the memory array 230 (shown in FIG. 2) has 6 bits of the computational results, there are 6 reference circuits 510-540 and 560-570 are arranged in each one of the local generator 911[0]-911[1]. Various numbers of the reference circuits to implement the local unit 410 are within the contemplated scope of the present disclosure.

For illustration of FIG. 9, the global unit (also indicated as the global generator) 420 includes several global circuits including, for example, a first global circuit 921, a second global circuit 922, a third global circuit 923, a fourth global circuit 924, a fifth global circuit 925 and a sixth global circuit 926. The first global circuit 921 is coupled to a global replica cell array (not shown), for receiving an initial global signal IG. The first global circuit 921 is further coupled to each one of the global circuits 922-926, for providing a base voltage signal Vin to each one of the global circuits 922-926. The first global circuit 921 is further coupled to the first reference circuit 510, for generating a global reference signal VREF[0] of the global reference signals VREF[0:5] to the first reference circuit 510. Thereby, a global current signal IGREF[0] is provided to the first reference circuit 510.

The global circuits 922-926 have the similar configurations, and are configured to provide the global reference signals VREF[1:5] to the reference circuits 520-240 and 560-570, respectively. Specifically, in response to the base voltage signal Vin, the second global circuit 922 is configured to generate a global reference signal VREF[1] of the global reference signals VREF[0:5] to the second reference circuit 520, based on a structural size of the second global circuit 922. Thereby, a global current signal IGREF[1] is provided to the second reference circuit 520.

Similarly, in response to the base voltage signal Vin, the third global circuit 923 is configured to generate a global reference signal VREF[2] of the global reference signals VREF[0:5] to the third reference circuit 530, based on a structural size of the third global circuit 923. In response to the base voltage signal Vin, the fourth global circuit 924 is configured to generate a global reference signal VREF[3] of the global reference signals VREF[0:5] to the fourth reference circuit 540, based on a structural size of the fourth global circuit 924. In response to the base voltage signal Vin, the fifth global circuit 925 is configured to generate a global reference signal VREF[4] of the global reference signals VREF[0:5] to the fifth reference circuit 560, based on a structural size of the fifth global circuit 925. In response to the base voltage signal Vin, the sixth global circuit 926 is configured to generate a global reference signal VREF[5] of the global reference signals VREF[0:5] to the sixth reference circuit 570, based on a structural size of the sixth global circuit 926. Thereby, global current signals IGREF[2]-IGREF[5] are provided to the third reference circuit 530, the fourth reference circuit 540, the fifth reference circuit 560 and the sixth reference circuit 570, respectively.

Figure 10:
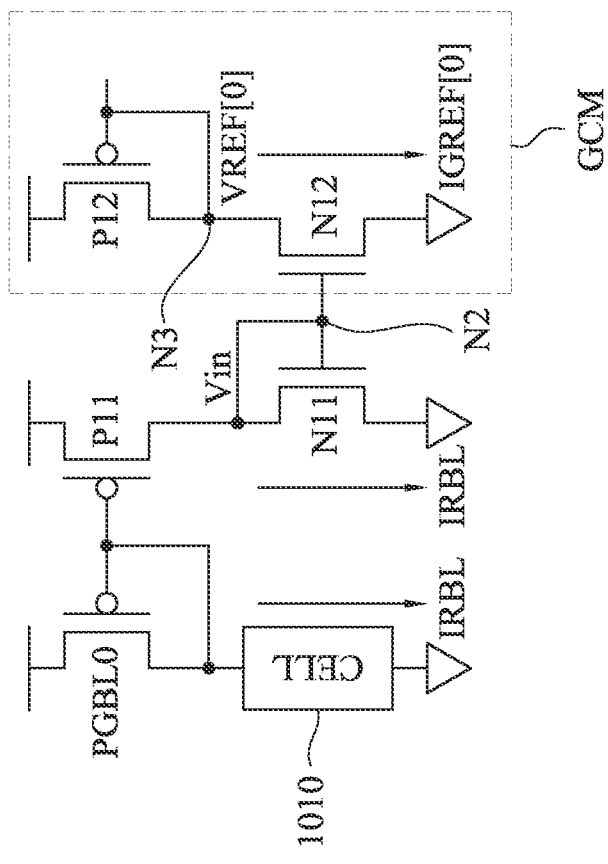
FIG. 10 is a circuit diagram of a first global circuit corresponding to the first global circuit in FIG. 9, in accordance with some embodiments of the present disclosure.

Reference is now made to FIG. 10. FIG. 10 is a circuit diagram of the first global circuit 921 in FIG. 9, in accordance with some embodiments of the present disclosure. As such, similar configurations are not further detailed herein. With respect to the embodiments of FIG. 9, like elements in FIG. 10 are designated with the same reference numbers for ease of understanding.

For illustration of FIG. 10, the first global circuit 921 includes a cell 1010, PMOS transistors PGBL0, P11 and P12, and NMOS transistors N11 and N12. Gate terminals of the PMOS transistors PGBL0 and P11 are coupled together, and are further coupled to a drain terminal of the PMOS transistor PGBL0. The drain terminal of the PMOS transistor PGBL0 is coupled to the cell 1010 which is further coupled to the second reference voltage (not shown). Source terminals of the PMOS transistor PGBL0 and P11 are coupled to the first reference voltage (not shown). A drain terminal of the PMOS transistor P11 is coupled to a drain terminal of the NMOS transistor N11 which is further coupled to gate terminals of the NMOS transistors N11 and N12 at a node N2. Source terminals of the NMOS transistors N11 and N12 are coupled to the second reference voltage (not shown). A drain terminal of the NMOS transistor N12 is coupled to a gate terminal and a drain terminal of the PMOS transistor P12 at a node N3. A source terminal of the PMOS transistor P12 is coupled to the first reference voltage (not shown).

The PMOS transistors PGBL0 and P11 are operated as a current mirror, and configured to provide the base voltage signal Vin at the node N2. Thereby, a base current signal IRBL flows through the PMOS transistor P11 to the NMOS transistor N11, by mirroring the current signal IRBL flowing through the PMOS transistor PGBL0 to the cell 1010.

In some embodiments, the PMOS transistors PGBL0 and P11 have the same structural size. In some other embodiments, the structural size includes a ratio of width to length. The width is referred to as a channel width of the corresponding transistor. The length is referred to as a gate length of the corresponding transistor, which is a distance between a source terminal and a drain terminal. With such configurations, a ratio of width to length of the PMOS transistor PGBL0 is equal to a ratio of width to length of the PMOS transistor P11. Alternatively stated, when the ratio of width to length of the PMOS transistor PGBL0 is 1, the ratio of width to length of the PMOS transistor P11 is also 1. Thereby, the base current signal IRBL outputting from the PMOS transistor P11 is equal to that outputting from the PMOS transistor PGBL0, which is also the base current signal IRBL.

With continued reference to FIG. 10, the PMOS transistor P12 and the NMOS transistor N12 are grouped as a proportional unit GCM. The global current signal IGREF[0] outputting from the proportional unit GCM is generated according to the base current signal IRBL flowing through the PMOS transistor P11 and the NMOS transistor N11. A value of the global current signal IGREF[0] is proportional to a value of the base current signal IRBL, since the NMOS transistors N11 and N12 are operated as a current mirror, and ratios of width to length of the NMOS transistors N11 and N12 are not the same. Specifically, in some embodiments, when the ratio of width to length of the NMOS transistor N11 is 1, the ratio of width to length of the NMOS transistor N12 is 7.785. With such configurations, a voltage, rather than the base voltage signal Vin, is provided at the node N3. Such voltage is referred to as the global reference signal VREF[0]. Thereby, the global current signal IGREF[0] flows through the proportional unit GCM, by mirroring the base current signal IRBL, with a proportion of 7.785, flowing through the NMOS transistor N11.

Furthermore, with reference to FIGS. 9-10, the proportional unit GCM of the first global circuit 921 is coupled to the first reference circuit 510, for providing the global reference signal VREF[0]. Specifically, the gate terminal and the drain terminal of the PMOS transistor P12 in FIG. 10 is coupled to through the switch SWP0 in FIG. 9 to the gate terminal of the PMOS transistor MPP0 in FIG. 9. When the switch SWP0 is turned on, the PMOS transistor P12 and the PMOS transistor MPP0 are operated as a current mirror, and are configured to provide the global reference signal VREF[0] at the gate terminals of the PMOS transistors P12 and MPP0. Thereby, the global current signal IGREF[0] flows through the PMOS transistor MPP0, by mirroring the current signal IGREF[0] flowing through the proportional unit GCM.

Figure 11:
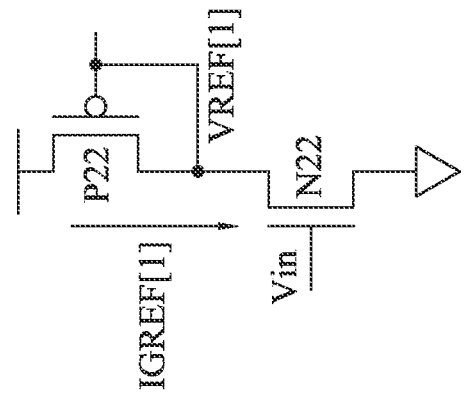
FIG. 11 is a circuit diagram of a second global circuit corresponding to the second global circuit in FIG. 9, in accordance with some embodiments of the present disclosure.

Reference is now made to FIG. 11. FIG. 11 is a circuit diagram of the second global circuit 922 corresponding to the second global generator in FIG. 9, in accordance with some embodiments of the present disclosure. As such, similar configurations are not further detailed herein. With respect to the embodiments of FIG. 9, like elements in FIG. 11 are designated with the same reference numbers for ease of understanding.

For illustration of FIG. 11, the second global circuit 922 includes a PMOS transistor P22 and a NMOS transistor N22. A gate terminal of the NMOS transistor N22 is configured to receive the base voltage signal Vin from the first global circuit 921 shown in FIGS. 9-10. The gate terminal of the NMOS transistor N22 is coupled to the gate terminal and the drain terminal of the NMOS transistor N11 of the first global circuit 921 at the node N2 shown in FIG. 10, in some embodiments. A source terminal of the NMOS transistor N22 is coupled to the second reference voltage (not shown). A drain terminal of the NMOS transistor N22 is coupled to a gate terminal and a drain terminal of the PMOS transistor P22. A source terminal of the PMOS transistor P12 is coupled to the first reference voltage (not shown).

The second global circuit 922 has a similar configuration as the proportional unit GCM shown in FIG. 10. In some embodiments, the second global circuit 922 has a similar configuration as at least one of the third global circuit 923, the fourth global circuit 924, the fifth global circuit 925 and the sixth global circuit 926 shown in FIG. 9. As such, similar configurations are not further detailed herein.

With reference to FIGS. 9-11, in some embodiments, NMOS transistors of the global circuits 922-926 and the NMOS transistor N12 of the first global circuit 921 have ratios of width to length that are different from one another. Therefore, as discussed above with reference to FIG. 10, a value of the global current signal IGREF[1] is proportional to a value of the base current signal IRBL, since the NMOS transistors N11 and N22 are operated as a current mirror, and ratios of width to length of the NMOS transistors N11 and N22 are different.

In some embodiments, with reference to FIGS. 9 and 11, when the ratio of width to length of the NMOS transistor N11 is 1, the ratio of width to length of the NMOS transistor N12 (shown in FIG. 10), indicated as "GCM0 RATIO", is 7.785. In such embodiment, the ratio of width to length of the NMOS transistor N22, indicated as "GCM1 RATIO", is 4. Also, the ratio of width to length of the NMOS transistor of the third global circuit 923 (not shown), indicated as "GCM2 RATIO", is 2. The ratio of width to length of the NMOS transistor of the fourth global circuit 924 (not shown), indicated as "GCM3 RATIO", is 1. The ratio of width to length of the NMOS transistor of the fifth global circuit 925 (not shown), indicated as "GCM4 RATIO", is 0.5. The ratio of width to length of the NMOS transistor of the sixth global circuit 926 (not shown), indicated as "GCM5 RATIO", is 0.25.

With the above configurations, various global reference signals VREF[1]-VREF[5] are provided at gate terminals and the drain terminals of the corresponding PMOS transistors of the global circuits 922-926. These global reference signals VREF[1]-VREF[5] are proportional to each other, and further have alternative proportions to the global reference signal VREF[0]. For example, in some embodiments, corresponding to the global reference signals VREF[1]-VREF[5], the proportions thereof to the base voltage signal Vin are 4, 2, 1, 0.5 and 0.25. Thereby, the global current signals IGREF[1]-IGREF[5] flowing through the corresponding global circuits 922-926 are generated by mirroring the base current signal IRBL, with the corresponding proportions, flowing through the NMOS transistor N11.

In some embodiments, the proportions of the global reference signals VREF[0]-VREF[5] are associated with a number of the outputs of the computational results. Various configurations of the proportions to implement the global reference signals VREF[0]-VREF[5] are within the contemplated scope of the present disclosure.

With reference to FIGS. 9-11, in some embodiments, PMOS transistors of the global circuits 922-926 and the PMOS transistor P12 of the first global circuit 921 have ratios of width to length that are different from one another. In some other embodiments, the PMOS transistors of the global circuits 922-926 have the same ratios of width to length of the NMOS transistors of the global circuits 922-926, respectively. In alternative embodiments, the PMOS transistors of the global circuits 922-926 have the same ratios of width to length of the PMOS transistors of the reference circuits 520-540 and 560-570, respectively.

In some embodiments, a system is disclosed. The system includes a global generator and a plurality of local generators. The global generator is coupled to a memory array, and is configured to generate a plurality of global signals, according to a number of a computational output of the memory array. The plurality of local generators are coupled to the global generator and the memory array, and are configured to generate a plurality of local signals, according to the plurality of global signals. Each one of the plurality of local generators includes a first reference circuit and a local current mirror. The first reference circuit is coupled to the global generator, and is configured to generate a first reference signal at a node, in response to a first global signal of the plurality of global signals. The local current mirror is coupled to the first reference circuit at the node, and is configured to generate the plurality of local signals, by mirroring a summation of at least one signal at the node.

In some embodiments, each one of the plurality of local generators further includes a plurality of second reference circuits. The plurality of second reference circuits are coupled to the global generator and the local current mirror, and are configured to generate a plurality of second reference signals at the node. Each one of the plurality of local signals is generated by mirroring the summation of the first reference signal and at least one of the plurality of second reference signals at the node.

In some embodiments, the plurality of second reference circuits are respectively activated in response to the plurality of global signals and a plurality of digital signals. The plurality of digital signals are associated with the plurality of second reference signals, respectively.

In some embodiments, a number of the plurality of second reference circuits is determined according to the number of the computational output of the memory array.

In some embodiments, each one of the plurality of local generators further includes a group of second reference circuits and a group of third reference circuits. The group of second reference circuits are coupled to the global generator and the local current mirror at the node, and are configured to generate a plurality of second reference signals, mirrored from the plurality of global signals respectively, at the node. The group of third reference circuits are coupled to the group of second reference circuits respectively, are coupled to the local current mirror, and are configured to generate a plurality of third reference signals, mirrored twice from the plurality of global signals respectively, at the node.

In some embodiments, the group of second reference circuits include a second reference circuit that is coupled to a third reference circuit of the group of third reference circuits at the node. when a value of the first reference signal is less than a value of a multiply-and-accumulate (MAC) signal output from the memory array, the second reference circuit is activated to generate a positive-phased reference signal of the plurality of second reference signals at the node, or the third reference circuit is activated to generate a negative-phased reference signal the plurality of third reference signals at the node, and one of the plurality of local signals is generated by mirroring the summation of the first reference signal and one of the positive-phased reference signal or the negative-phased reference signal at the node.

In some embodiments, the global generator further includes a plurality of global circuits. The plurality of global circuits are configured to generate the plurality of global signals that are different from each other, respectively. The first global signal is mirrored from one of the plurality of global circuits to the first reference circuit.

In some embodiments, the system further includes a sense amplifier. The sense amplifier is coupled to the local current mirror. The sense amplifier is configured to compare the plurality of local signals with a multiply-and-accumulate (MAC) signal output from the memory array, to respectively generate a plurality of digital signals for distinguishing candidates of the computational output.

In some embodiments, a system is also disclosed. The system includes at least one local generator. The at least one local generator is coupled to a memory array, and is configured to generate a plurality of digital signals, for distinguishing candidates of a computational output of the memory array. The at least one local generator includes a first reference circuit, at least one second reference circuit and a sense amplifier. The first reference circuit is configured to generate a first reference signal at a node, in response to a first global signal of a plurality of global signals. The at least one second reference circuit is coupled to the first reference circuit, and is configured to generate a second reference signal at the node, in response to a second global signal of the plurality of global signals and a first digital signal of the plurality of digital signals. The sense amplifier is coupled to the memory array, the first reference circuit and the at least one second reference circuit, and is configured to generate the plurality of digital signals, according to a multiply-and-accumulate (MAC) signal output from the memory array and signals accumulated at the node.

In some embodiments, the system further includes a global generator. The global generator is coupled to the memory array and the at least one local generator, and is configured to generate the plurality of global signals. The plurality of global signals are different from each other and values thereof are proportional to each other.

In some embodiments, the global generator further includes a plurality of first transistors of a first conductive type and a plurality of second transistors of a second conductive type. First terminals of the plurality of first transistors are coupled to the first reference circuit and the at least one second reference circuit, respectively. Gate terminals and first terminals of the plurality of second transistors are coupled together to second terminals of the plurality of first transistors, and are configured to mirror the plurality of global signals through the plurality of first transistors to the first reference circuit and the at least one second reference circuit, respectively.

In some embodiments, the first reference circuit includes a first switch and a second transistor. The first switch is coupled to a global generator, and is configured to receive the first global signal output from the global generator. A gate terminal of the second transistor is coupled to the first switch, and is configured to receive the first global signal, for generating the first reference signal mirrored from the global generator. A first terminal the second transistor is coupled to the node.

In some embodiments, the at least one second reference circuit includes a first switch and a second transistor of a first conductive type. The first switch is coupled to a global generator, and is configured to receive the second global signal output from the global generator when the first digital signal having a first logic value. A gate terminal of the second transistor is coupled to the first switch, and configured to receive the second global signal, for generating the second reference signal mirrored from the global generator. A first terminal the second transistor is coupled to the node.

In some embodiments, the at least one second reference circuit further includes a second switch, a third transistor of the first conductive type, and a current mirror. The second switch is coupled to the global generator and the first switch, and is configured to receive the second global signal output from the global generator when the first digital signal having a second logic value. A gate terminal of the third transistor is coupled to the second switch, and is configured to receive the second global signal, for generating the second reference signal mirrored from the global generator. The current mirror is coupled to a first terminal of the third transistor and the node, and is configured to mirror the second reference signal from the third transistor to the node.

In some embodiments, the at least one local generator further includes a local current mirror. The local current mirror is coupled to the first reference circuit and the at least one second reference circuit at the node. The local current mirror is configured to mirror the signals accumulated at the node to one of inputs of the sense amplifier.

In some embodiments, the at least one second reference circuit includes a first group of second reference circuits and a second group of second reference circuits. The first group of second reference circuits are coupled together at the node, and are configured to receive the plurality of global signals and to generate a plurality of second reference signals with a first phase at the node, when the plurality of digital signals have a first logic value. The second group of second reference circuits are coupled together at the node, and are configured to receive the plurality of global signals and to generate the plurality of second reference signals with a second phase at the node, when the plurality of digital signals have a second logic value.

In some embodiments, a number of the first group of second reference circuits is equal to a number of the second group of second reference circuits, and is determined according to a number of the computational output of the memory array.

In some embodiments, a method is also disclosed. The method includes the following operations: in response to a plurality of global signals and a first digital signal, generating a plurality of reference signals to a node; accumulating the plurality of reference signals at the node, to generate a plurality of local signals; and comparing the plurality of local signals with a multiply-and-accumulate (MAC) signal, to generate a plurality of digital signals to a memory array. The first digital signal and the plurality of digital signals are configured to distinguish candidates of a computational output of the memory array.

In some embodiments, the method further includes the following operations: generating the plurality of global signals, by a number of global circuits having widths-to-lengths ratios that are different from each other. The number of the global circuits is determined according to a number of the computational output of the memory array.

In some embodiments, the plurality of reference signals comprise a first reference signal and a second reference signal. The first reference signal is generated, by mirroring from one of the plurality of global signals, at the node. The second reference signal is generated, by mirroring from another one of the plurality of global signals, at the node. The first reference signal and the second reference signal have different phases that are inverse to each other at the node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A system, comprising:
a global generator coupled to a memory array, and configured to generate a plurality of global signals, according to a number of a computational output of the memory array; and
a plurality of local generators coupled to the global generator and the memory array, and configured to generate a plurality of local signals, according to the plurality of global signals,
wherein each one of the plurality of local generators comprises:
a first reference circuit coupled to the global generator, and configured to generate a first reference signal at a node, in response to a first global signal of the plurality of global signals; and a local current mirror coupled to the first reference circuit at the node, and configured to generate the plurality of local signals, by mirroring a summation of at least one signal at the node.

2. The system of claim 1, wherein each one of the plurality of local generators further comprises:
a plurality of second reference circuits coupled to the global generator and the local current mirror, and configured to generate a plurality of second reference signals at the node,
wherein each one of the plurality of local signals is generated by mirroring the summation of the first reference signal and at least one of the plurality of second reference signals at the node.

3. The system of claim 2, wherein
the plurality of second reference circuits are respectively activated in response to the plurality of global signals and a plurality of digital signals, and
the plurality of digital signals are associated with the plurality of second reference signals, respectively.

4. The system of claim 2, wherein a number of the plurality of second reference circuits is determined according to the number of the computational output of the memory array.

5. The system of claim 1, wherein each one of the plurality of local generators further comprises:
a group of second reference circuits coupled to the global generator and the local current mirror at the node, and configured to generate a plurality of second reference signals, mirrored from the plurality of global signals respectively, at the node; and
a group of third reference circuits coupled to the group of second reference circuits respectively, coupled to the local current mirror, and configured to generate a plurality of third reference signals, mirrored twice from the plurality of global signals respectively, at the node.

6. The system of claim 5, wherein the group of second reference circuits comprise a second reference circuit that is coupled to a third reference circuit of the group of third reference circuits at the node,
wherein when a value of the first reference signal is less than a value of a multiply-and-accumulate (MAC) signal output from the memory array,
the second reference circuit is activated to generate a positive-phased reference signal of the plurality of second reference signals at the node, or
the third reference circuit is activated to generate a negative-phased reference signal the plurality of third reference signals at the node, and
one of the plurality of local signals is generated by mirroring the summation of the first reference signal and one of the positive-phased reference signal or the negative-phased reference signal at the node.

7. The system of claim 1, wherein the global generator further comprises:
a plurality of global circuits configured to generate the plurality of global signals that are different from each other, respectively,
wherein the first global signal is mirrored from one of the plurality of global circuits to the first reference circuit.

8. The system of claim 1, further comprising:
a sense amplifier coupled to the local current mirror,
wherein the sense amplifier is configured to compare the plurality of local signals with a multiply-and-accumulate (MAC) signal output from the memory array, to respectively generate a plurality of digital signals for distinguishing candidates of the computational output.

9. A system, comprising:
at least one local generator coupled to a memory array, and configured to generate a plurality of digital signals, for distinguishing candidates of a computational output of the memory array, and comprising:
a first reference circuit configured to generate a first reference signal at a node, in response to a first global signal of a plurality of global signals;
at least one second reference circuit coupled to the first reference circuit, and configured to generate a second reference signal at the node, in response to a second global signal of the plurality of global signals and a first digital signal of the plurality of digital signals; and
a sense amplifier coupled to the memory array, the first reference circuit and the at least one second reference circuit, and configured to generate the plurality of digital signals, according to a multiply-and-accumulate (MAC) signal output from the memory array and signals accumulated at the node.

10. The system of claim 9, further comprising:
a global generator coupled to the memory array and the at least one local generator, and configured to generate the plurality of global signals,
wherein the plurality of global signals are different from each other and values thereof are proportional to each other.

11. The system of claim 10, wherein the global generator further comprises:
a plurality of first transistors of a first conductive type, wherein first terminals of the plurality of first transistors are coupled to the first reference circuit and the at least one second reference circuit, respectively; and
a plurality of second transistors of a second conductive type, wherein gate terminals and first terminals of the plurality of second transistors are coupled together to second terminals of the plurality of first transistors, and configured to mirror the plurality of global signals through the plurality of first transistors to the first reference circuit and the at least one second reference circuit, respectively.

12. The system of claim 9, wherein the first reference circuit comprises:
a first switch coupled to a global generator, and configured to receive the first global signal output from the global generator; and
a second transistor, wherein
a gate terminal of the second transistor is coupled to the first switch, and configured to receive the first global signal, for generating the first reference signal mirrored from the global generator, and
a first terminal the second transistor is coupled to the node.

13. The system of claim 9, wherein the at least one second reference circuit comprises:
a first switch coupled to a global generator, and configured to receive the second global signal output from the global generator when the first digital signal having a first logic value; and
a second transistor of a first conductive type, wherein
a gate terminal of the second transistor is coupled to the first switch, and configured to receive the second global signal, for generating the second reference signal mirrored from the global generator, and
a first terminal the second transistor is coupled to the node.

14. The system of claim 13, wherein the at least one second reference circuit further comprises:
- a second switch coupled to the global generator and the first switch, and configured to receive the second global signal output from the global generator when the first digital signal having a second logic value;
- a third transistor of the first conductive type, wherein a gate terminal of the third transistor is coupled to the second switch, and configured to receive the second global signal, for generating the second reference signal mirrored from the global generator; and
- a current mirror coupled to a first terminal of the third transistor and the node, and configured to mirror the second reference signal from the third transistor to the node.

15. The system of claim 9, wherein the at least one local generator further comprises:
- a local current mirror coupled to the first reference circuit and the at least one second reference circuit at the node,
- wherein the local current mirror is configured to mirror the signals accumulated at the node to one of inputs of the sense amplifier.

16. The system of claim 9, wherein the at least one second reference circuit comprises:
- a first group of second reference circuits coupled together at the node, and configured to receive the plurality of global signals and to generate a plurality of second reference signals with a first phase at the node, when the plurality of digital signals have a first logic value; and
- a second group of second reference circuits coupled together at the node, and configured to receive the plurality of global signals and to generate the plurality of second reference signals with a second phase at the node, when the plurality of digital signals have a second logic value.

17. The system of claim 16, wherein
a number of the first group of second reference circuits is equal to a number of the second group of second reference circuits, and is determined according to a number of the computational output of the memory array.

18. A method, comprising:
in response to a plurality of global signals and a first digital signal, generating a plurality of reference signals to a node;
accumulating the plurality of reference signals at the node, to generate a plurality of local signals; and
comparing the plurality of local signals with a multiply-and-accumulate (MAC) signal, to generate a plurality of digital signals to a memory array,
wherein the first digital signal and the plurality of digital signals are configured to distinguish candidates of a computational output of the memory array.

19. The method of claim 18, further comprising:
generating the plurality of global signals, by a number of global circuits having widths-to-lengths ratios that are different from each other,
wherein the number of the global circuits is determined according to a number of the computational output of the memory array.

20. The method of claim 18, wherein
the plurality of reference signals comprise a first reference signal and a second reference signal,
the first reference signal is generated, by mirroring from one of the plurality of global signals, at the node,
the second reference signal is generated, by mirroring from another one of the plurality of global signals, at the node, and
the first reference signal and the second reference signal have different phases that are inverse to each other at the node.

* * * * *